(12) United States Patent
Temmei et al.

(10) Patent No.: US 10,128,164 B2
(45) Date of Patent: Nov. 13, 2018

(54) ELECTRONIC DEVICE AND METHOD OF MANUFACTURING THE ELECTRONIC DEVICE

(71) Applicant: HITACHI AUTOMOTIVE SYSTEMS, LTD., Hitachinaka-shi, Ibaraki (JP)

(72) Inventors: Hiroyuki Temmei, Tokyo (JP); Mina Amo, Tokyo (JP); Nobutake Tsuyuno, Tokyo (JP); Takeshi Tokuyama, Tokyo (JP); Toshiaki Ishii, Tokyo (JP); Toshiya Satoh, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 69 days.

(21) Appl. No.: 15/520,167

(22) PCT Filed: Oct. 15, 2015

(86) PCT No.: PCT/JP2015/079204
§ 371 (c)(1),
(2) Date: Apr. 19, 2017

(87) PCT Pub. No.: WO2016/067930
PCT Pub. Date: May 6, 2016

(65) Prior Publication Data
US 2017/0309540 A1    Oct. 26, 2017

(30) Foreign Application Priority Data

Oct. 29, 2014 (JP) ................................ 2014-220440

(51) Int. Cl.
*H01L 23/367* (2006.01)
*H01L 23/62* (2006.01)
(Continued)

(52) U.S. Cl.
CPC ........ *H01L 23/367* (2013.01); *H01L 21/4825* (2013.01); *H01L 21/4882* (2013.01);
(Continued)

(58) Field of Classification Search
None
See application file for complete search history.

(56) References Cited

U.S. PATENT DOCUMENTS

| 5,223,739 A | 6/1993 | Katsumata et al. |
| 8,492,202 B2 * | 7/2013 | Kajiwara ................ H01L 21/56 257/705 |

(Continued)

FOREIGN PATENT DOCUMENTS

| JP | 57-173948 | 10/1982 |
| JP | 59-186397 A | 10/1984 |

(Continued)

OTHER PUBLICATIONS

International Search Report of PCT/JP2015/079204 dated Dec. 22, 2015.

(Continued)

*Primary Examiner* — Andres Munoz
(74) *Attorney, Agent, or Firm* — Mattingly & Malur, PC

(57) ABSTRACT

An electronic component has a semiconductor element and a thermally conductive support member. A heat sink is disposed on one surface of the circuit body, and a thermally conductive insulating member is interposed between the heat sink and the support member. Input and output terminals and a ground terminal are also provided. A sealing resin is formed to expose a part of each of the input and output terminals and the ground terminal and one surface of the heat sink, and to cover a periphery of the electronic component structure. A main body conductor layer is formed to be insulated from the input and output terminals and cover (Continued)

an immersion region of the sealing resin and one surface of the heat sink immersed in a cooling medium. A ground conductor layer covers at least a part of the ground terminal and is electrically connected with the main body conductor layer.

15 Claims, 16 Drawing Sheets

(51) Int. Cl.
    *H01L 25/07*     (2006.01)
    *H01L 25/18*     (2006.01)
    *H01L 21/48*     (2006.01)
    *H01L 21/56*     (2006.01)
    *H01L 23/31*     (2006.01)
    *H01L 23/495*     (2006.01)
    *H01L 23/00*     (2006.01)

(52) U.S. Cl.
    CPC .......... *H01L 21/56* (2013.01); *H01L 23/3142* (2013.01); *H01L 23/49517* (2013.01); *H01L 23/49541* (2013.01); *H01L 23/49562* (2013.01); *H01L 23/49568* (2013.01); *H01L 23/49582* (2013.01); *H01L 23/62* (2013.01); *H01L 24/27* (2013.01); *H01L 24/32* (2013.01); *H01L 25/07* (2013.01); *H01L 25/18* (2013.01); *H01L 23/3107* (2013.01); *H01L 2224/27462* (2013.01); *H01L 2224/27464* (2013.01); *H01L 2224/48091* (2013.01); *H01L 2224/48247* (2013.01); *H01L 2924/181* (2013.01); *H01L 2924/1815* (2013.01)

(56) References Cited

U.S. PATENT DOCUMENTS

| | | | | |
|---|---|---|---|---|
| 8,653,652 | B2* | 2/2014 | Tokuyama | H01L 25/072 257/722 |
| 8,659,130 | B2* | 2/2014 | Takagi | H01L 23/3675 257/675 |
| 8,921,989 | B2* | 12/2014 | Horimoto | H01L 23/4334 257/678 |
| 9,059,334 | B2* | 6/2015 | Usui | H01L 23/4334 |
| 9,076,780 | B2* | 7/2015 | Negishi | H01L 21/565 |
| 9,236,324 | B2* | 1/2016 | Besshi | H01L 23/3107 |
| 9,615,442 | B2* | 4/2017 | Oi | H01L 23/3735 |
| 9,852,962 | B2* | 12/2017 | Temmei | H01L 23/473 |
| 2004/0061138 | A1 | 4/2004 | Shinohara et al. | |
| 2006/0091512 | A1* | 5/2006 | Shinohara | H01L 23/4334 257/678 |
| 2007/0096278 | A1* | 5/2007 | Nakatsu | H01L 23/3675 257/678 |
| 2007/0273009 | A1 | 11/2007 | Hauenstein | |
| 2008/0017999 | A1* | 1/2008 | Kikuchi | H01L 23/3128 257/787 |
| 2009/0243078 | A1* | 10/2009 | Lim | H01L 23/4334 257/690 |
| 2009/0302444 | A1* | 12/2009 | Ueda | H01L 21/565 257/675 |

FOREIGN PATENT DOCUMENTS

| | | |
|---|---|---|
| JP | 64-037043 A | 2/1989 |
| JP | 04-127456 A | 4/1992 |
| JP | 2004-119667 A | 4/2004 |
| JP | 2006-128260 A | 5/2006 |
| JP | 2008-270294 A | 11/2008 |
| JP | 2010-225752 A | 10/2010 |
| JP | 5290963 A | 6/2013 |

OTHER PUBLICATIONS

Japanese Office Action received in corresponding Japanese Application No. 2016-556497 dated Dec. 19, 2017.

* cited by examiner (a)         (b)

(a)

(b)

(c)

(a)

(b)

(1) 501&504 ON (2) 502&503 ON (3) DRIVE WAVEFORM (a)  (b)

ELECTRONIC DEVICE AND METHOD OF MANUFACTURING THE ELECTRONIC DEVICE

TECHNICAL FIELD

The present invention relates to an electronic device including a circuit body having a semiconductor element and a method of manufacturing the electronic device.

BACKGROUND ART

An electronic device having a power conversion device for driving a motor is mounted on a hybrid vehicle or an electric vehicle. An electronic device provided with a power conversion device converts DC power supplied from a power supply battery into AC power to drive a motor. On the contrary, the power conversion device converts AC power regenerated by the motor into DC power and stores the DC power in an electric storage device. A semiconductor device that generates heat at a high temperature is housed inside a case of such an electronic device, and immersed in a cooling medium such as cooling water and cooled.

Up to now, a power semiconductor device has been known in which a semiconductor element such as an IGBT is sealed with a resin and a surface of the device that comes into contact with a cooling medium is covered with a metal film. In that structure, with the formation of the metal film, heat dissipation is improved, and a waterproof property against the cooling medium is enhanced (refer to Patent Literature 1).

CITATION LIST

Patent Literature

Patent Literature 1: Japanese Patent Unexamined Publication Application No. 2004-119667

SUMMARY OF INVENTION

Technical Problem

In a circuit such as a power conversion circuit in which a semiconductor element performs a switching operation, a surge voltage which is an instantaneous jump-up voltage is applied to the semiconductor element. In the power semiconductor device disclosed in Patent Literature 1, measures against the surge voltage are not taken, resulting in a risk that the semiconductor element is destroyed. This necessitates the use of a semiconductor element with high withstand voltage which is expensive.

Solution to Problem

According to a first aspect of the present invention, there is provided an electronic device including: an electronic component structure that includes a circuit body having a semiconductor element with an input electrode and an output electrode and a thermally conductive support member for supporting the semiconductor element, a heat sink that is disposed on one surface of the circuit body to be thermally conductible, a thermally conductive insulating member that is interposed between the heat sink and the thermally conductive support member, an input terminal that is connected to the input electrode, an output terminal that is connected to the output electrode, and a ground terminal; a sealing resin that is formed to expose a part of each of the input terminal, the output terminal and the ground terminal and one surface of the heat sink, and cover a periphery of the electronic component structure; a main body conductor layer that is formed to be insulated from the input terminal and the output terminal and formed to cover an entire surface of an immersion region of the sealing resin and one surface of the heat sink immersed in a cooling medium; and a ground conductor layer that covers at least apart of the ground terminal and is electrically connected with the main body conductor layer.

Advantageous Effects of Invention

According to the present invention, the surge voltage can be supplied to the common ground through the ground terminal. As a result, an inexpensive semiconductor element can be used.

DESCRIPTION OF EMBODIMENTS

First Embodiment

Hereinafter, an electronic device and a manufacturing method thereof according to embodiments of the present invention will be described with reference to FIGS. 1 to 10.

[Structure of Electronic Device]

Figure 1:
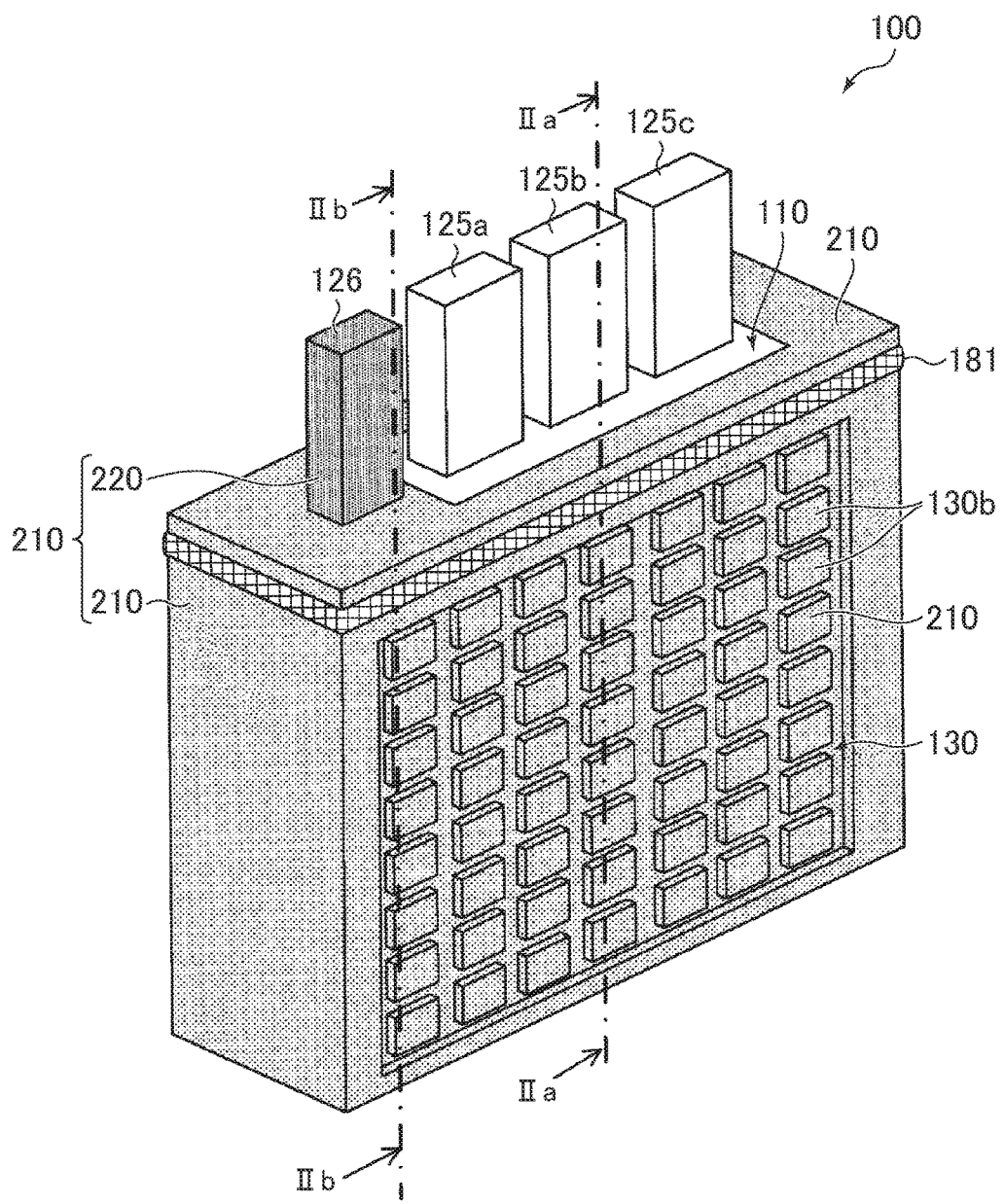
FIG. 1 is an external perspective view of an electronic device according to a first embodiment of the present invention.
Figure 2:
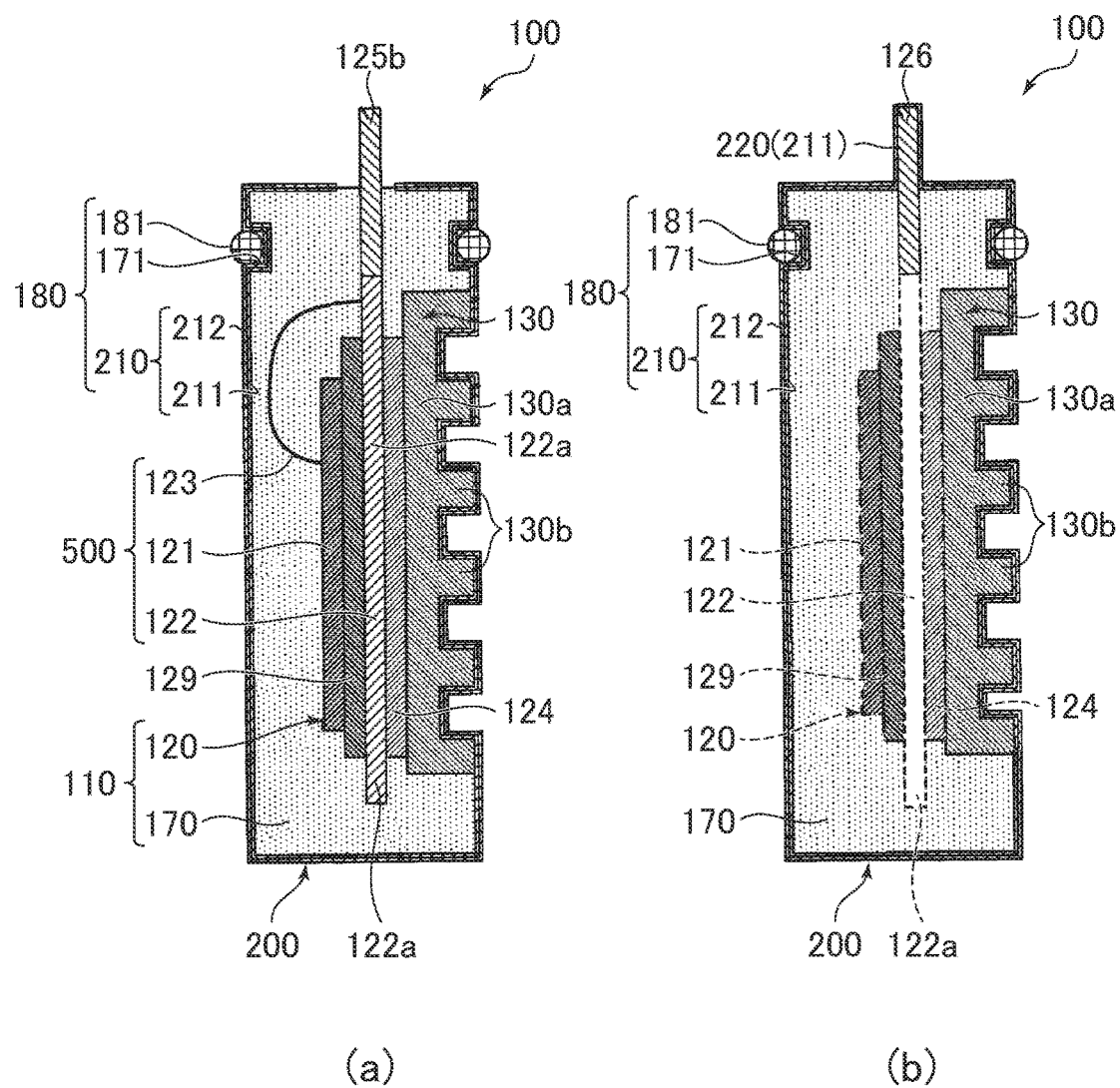
FIG. 2(*a*) is a cross-sectional view taken along a line IIa-IIa of FIG. 1 and FIG. 2(*b*) is a cross-sectional view taken along a line IIb-IIb of FIG. 1.
Figure 3:
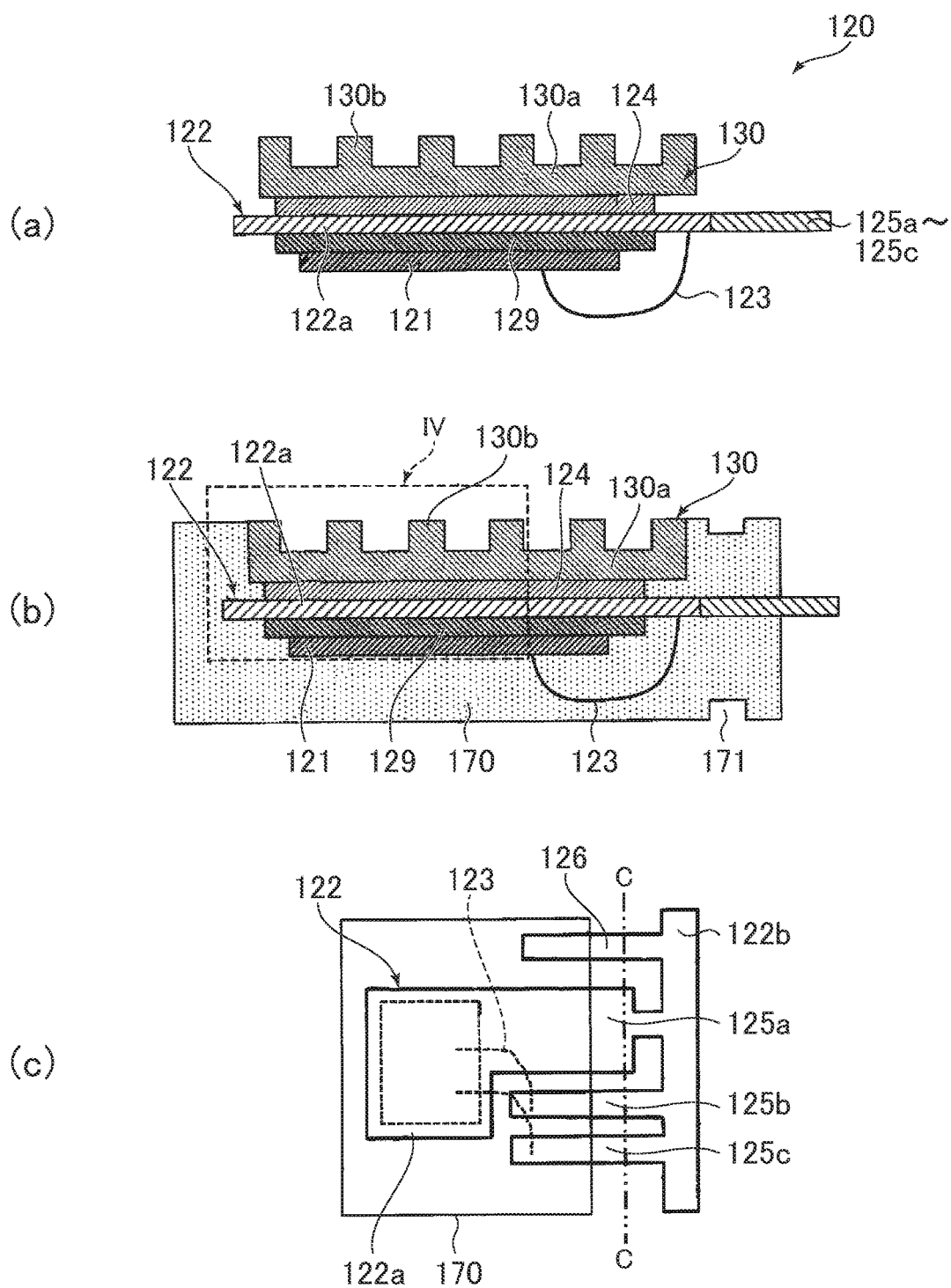
FIG. 3(*a*) is a cross-sectional view of the electronic component structure, FIG. 3(*b*) is a sectional view for illustrating a next step of FIG. 3(*a*), and FIG. 3(*c*) is a diagram of a lead frame before cutting viewed from a top surface of FIG. 3(*b*).
Figure 4:
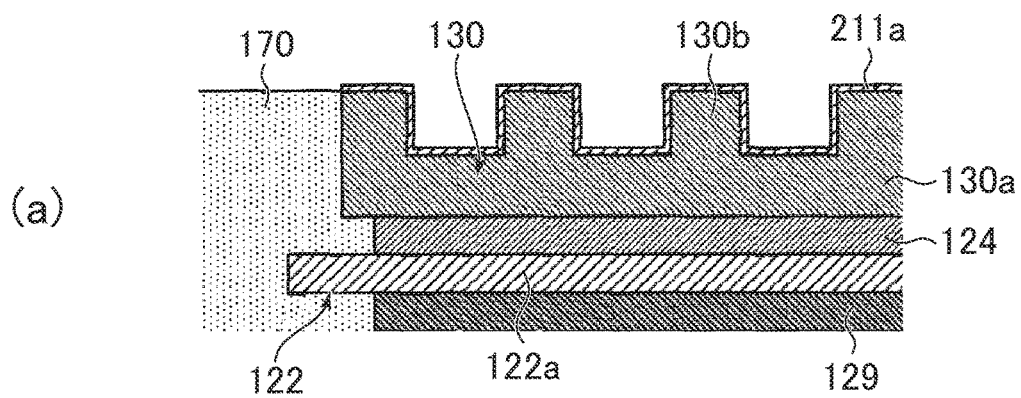
FIGS. 4(*a*) to 4(*c*) are cross-sectional views illustrating a first example of a method of forming a conductor layer in an electronic module.
Figure 4:
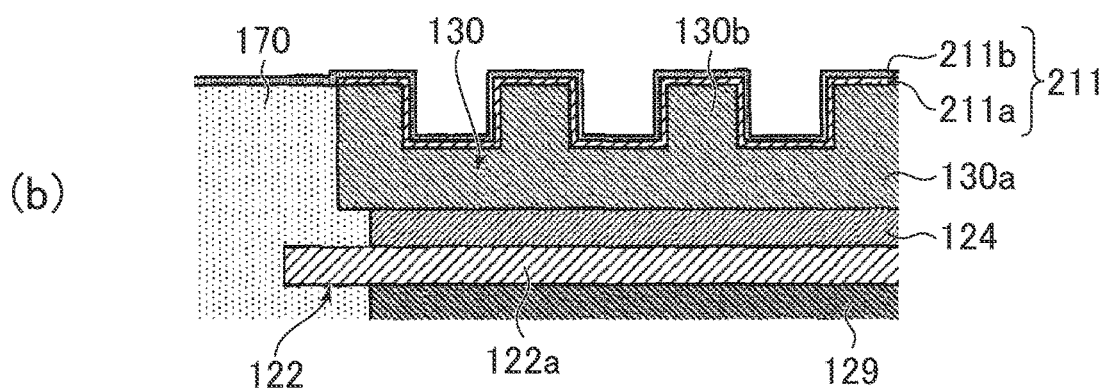
Figure 4:
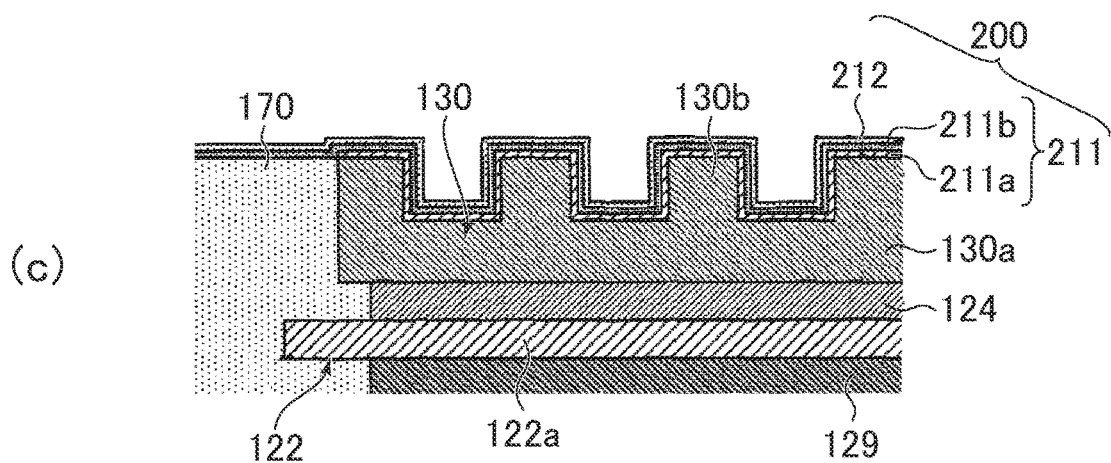
Figure 5:
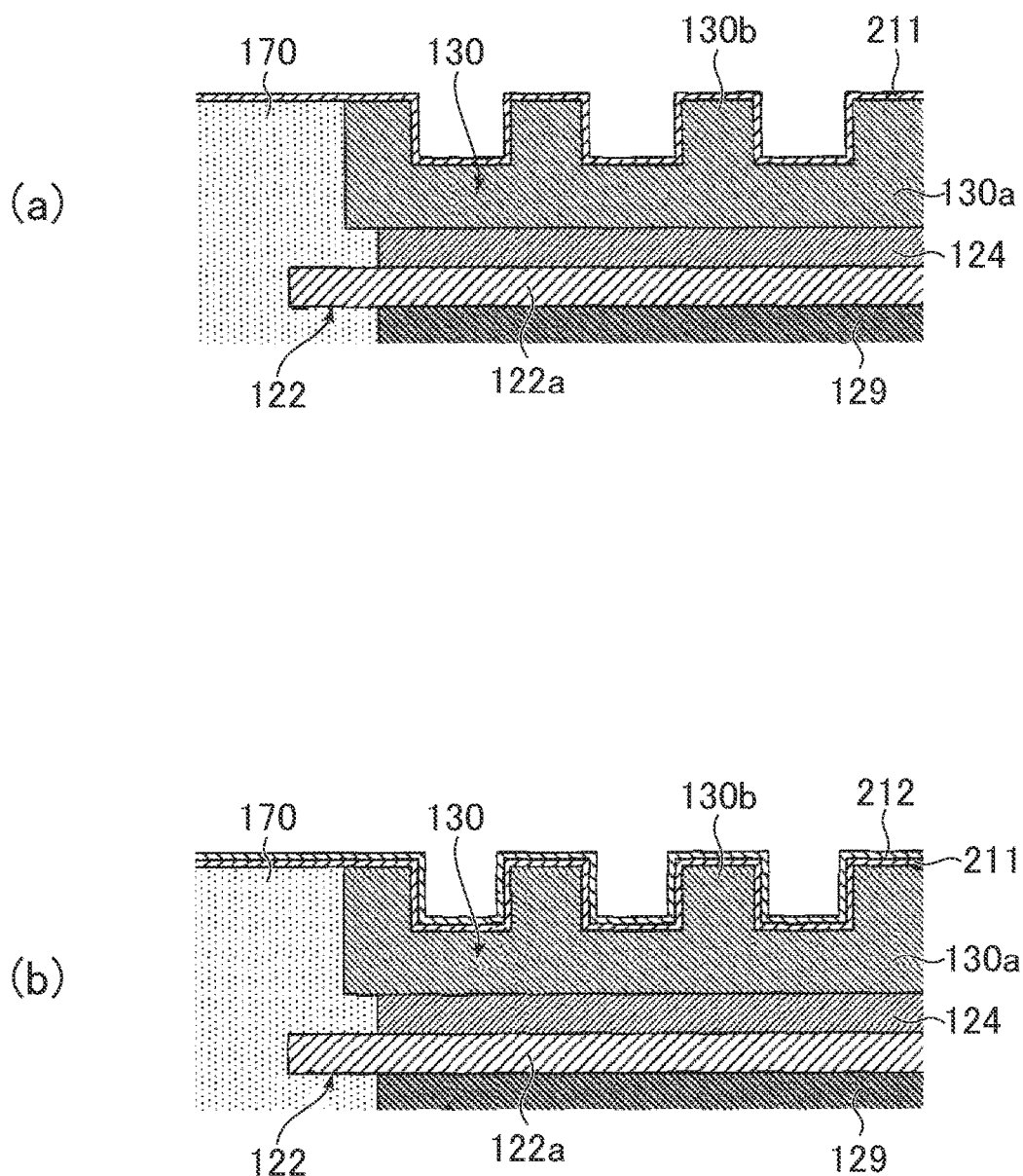
FIGS. 5(*a*) and 5(*b*) are cross-sectional views illustrating a second example of the method of forming the conductor layer in the electronic module.
Figure 6:
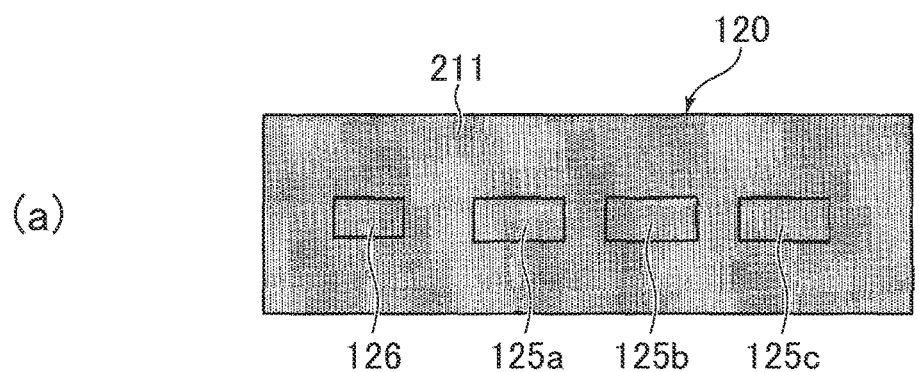
FIG. 6(*a*) is a top view of the electronic module that has been subjected to electroless plating, and FIG. 6(*b*) is an external perspective view for illustrating a process subsequent to a process in FIG. 6(*a*).
Figure 6:
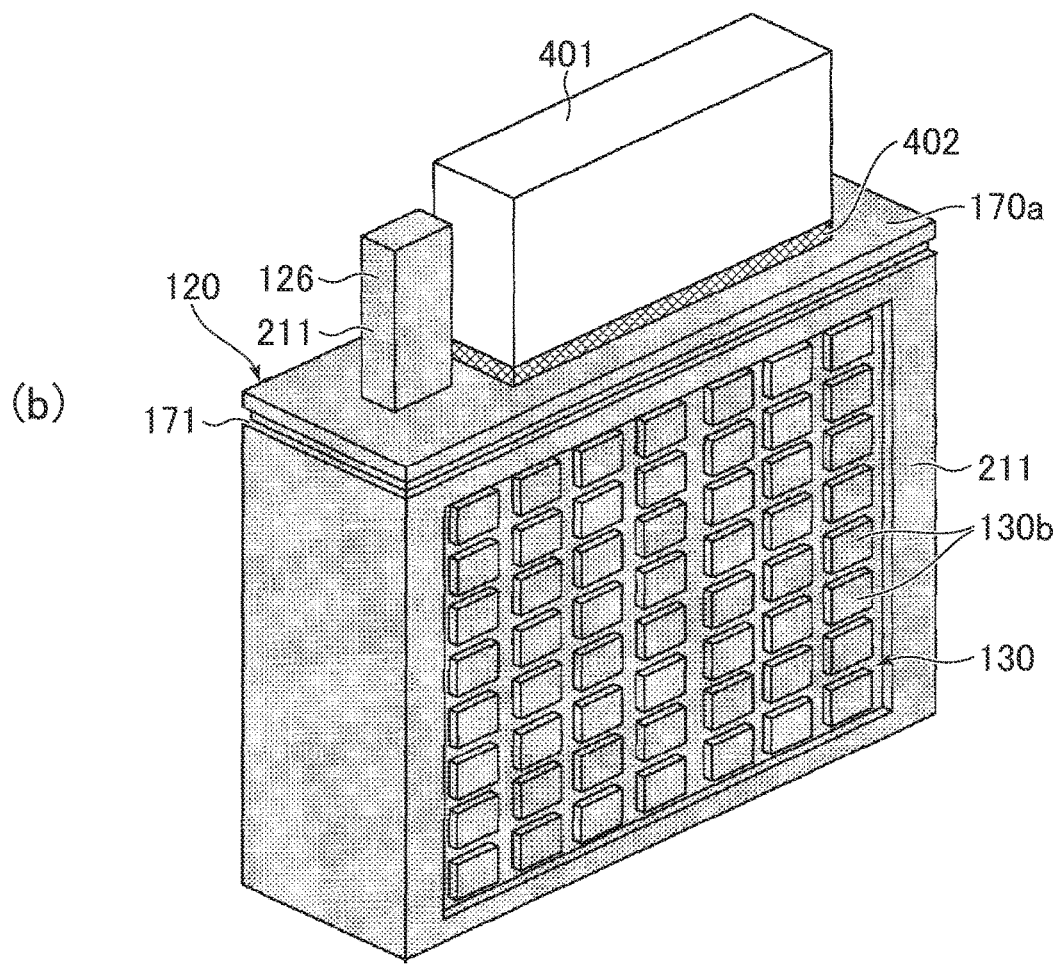
Figure 7:
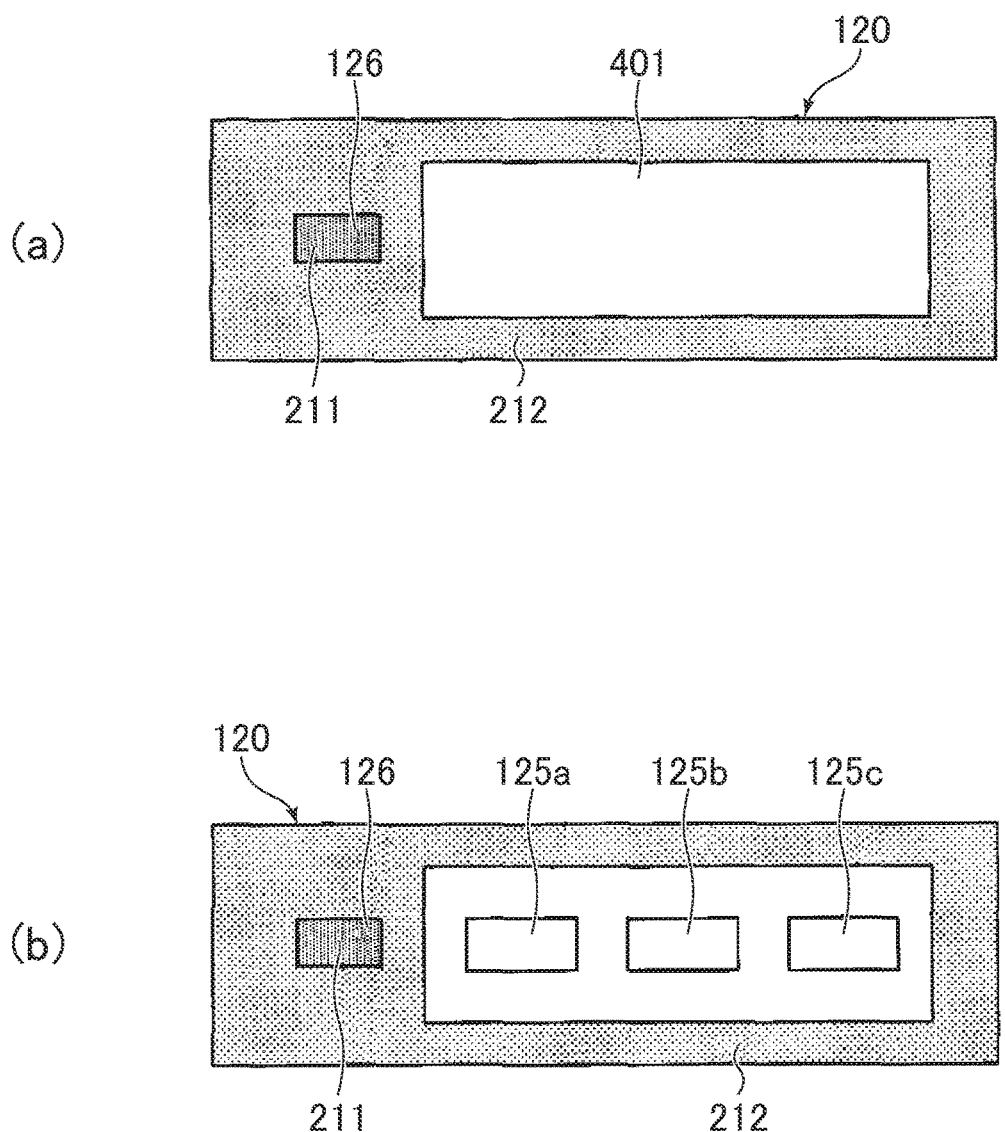
FIG. 7(*a*) is a top view of the electronic module for illustrating a process subsequent to the process of FIG. 6(*b*), and FIG. 7(*b*) is a top view of the electronic module for illustrating a process subsequent to the process of FIG. 7(*a*).
Figure 8:
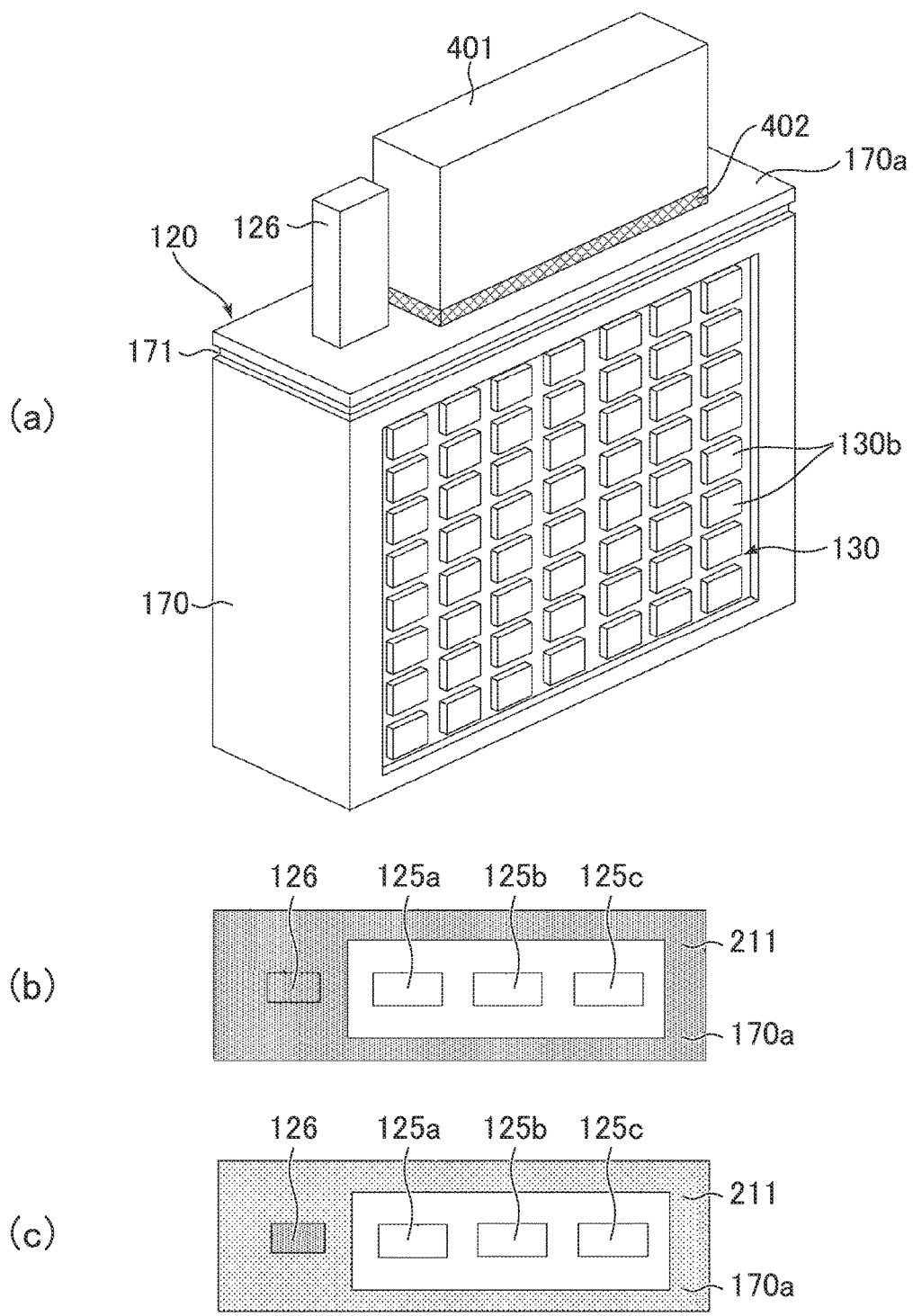
FIG. 8(*a*) is an external perspective view of the electronic module for illustrating a process before performing the electroless plating, FIG. 8(*b*) is a top view of the electronic module for illustrating a process subsequent to the process in FIG. 8(*a*), and FIG. 8(*c*) is a top view of the electronic module for illustrating a process subsequent to the process of FIG. 8(*b*).
Figure 9:
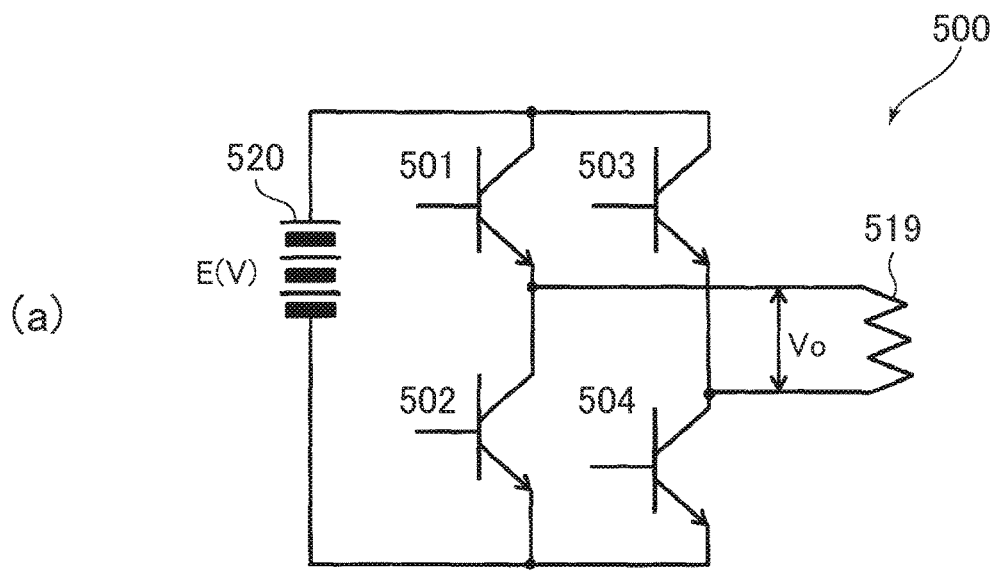
FIG. 9(*a*) is a circuit diagram as one example of the circuit body according to the present invention, and FIG. 9(*b*) is a timing chart of input/output signals of the circuit body.
Figure 9:
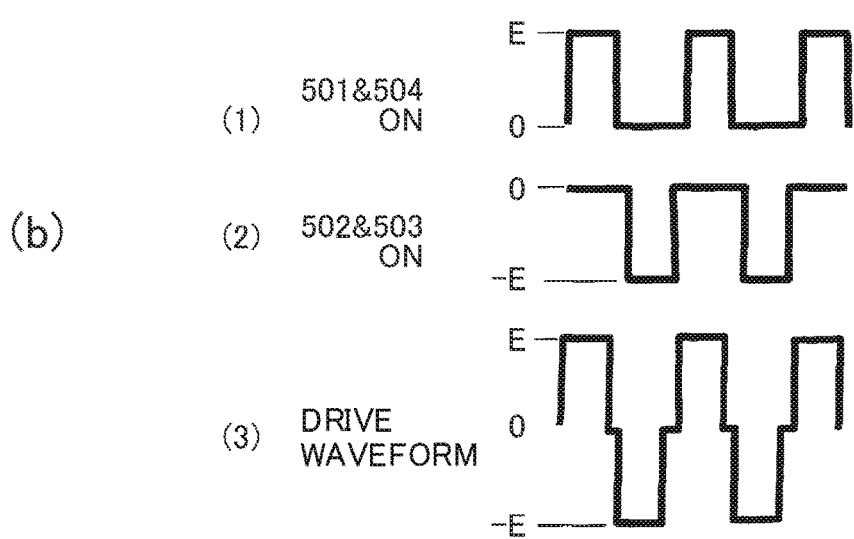

FIG. 1 is an external perspective view of an electronic device according to a first embodiment of the present invention. FIG. 2(a) is a cross-sectional view taken along a line IIa-IIa of FIG. 1, and FIG. 2(b) is a cross-sectional view taken along a line IIb-IIb of FIG. 1.

An electronic device 100 is mounted on, for example, a hybrid vehicle or an electric vehicle and is used as a power conversion device for driving a motor or the like.

The electronic device 100 includes an electronic module 110 and a conductor layer 200 provided in a region of an overall surface of the electronic module 110 excluding a part of an upper surface side of the electronic module 110. The electronic module 110 includes an electronic component structure 120 (refer to FIG. 3) and a sealing resin 170.

The electronic component structure 120 includes an electronic component 121, a bonding material 129, a lead frame (heat conductive support member) 122 which is a metal member, a heat conductive insulating member 124, and a heat sink 130. In addition, the electronic component structure 120 includes a plurality (three in the embodiment) of lead terminals 125a to 125c and a ground terminal 126.

The sealing resin 170 seals an overall periphery of the electronic component structure 120 so as to expose front end sides of the lead terminals 125a to 125c and the ground terminal 126 and one surface of the heat sink 130.

A groove 171 that goes around a peripheral side surface of the sealing resin 170 is provided in the vicinity of an upper surface side of the sealing resin 170.

The conductor layer 200 includes a main body conductor layer 210 that covers the sealing resin 170 and one surface of the heat sink 130 and a ground conductor layer 220 that is formed to cover the ground terminal 126. The main body conductor layer 210 and the ground conductor Layer 220 are electrically connected to each other. Each of the lead terminals 125a to 125c is insulated from both of the main body conductor layer 210 and the ground conductor layer 220.

The main body conductor layer 210 is also formed in the groove 171 of the sealing resin 170, and a sealing member 181 is fitted into the groove 171 in a state of being in close contact with an outer surface of the main body conductor layer 210 formed in the groove 171. In other words, a sealing portion 180 is configured by the groove 171 of the sealing resin 170, the main body conductor layer 210 formed in the groove 171, and the seal member 181. Although not shown, the electronic device 100 is installed in such a manner that the sealing member 181 is press-fitted and sealed to a periphery of the opening portion of a flow path forming body in which a cooling path where a cooling medium is refluxed is formed. In other words, a side of the electronic device 100 lower than the sealing portion 180 is immersed in the cooling medium.

The electronic component 121 of the electronic component structure 120 is formed of a semiconductor device that deals with large electric power, for example, such as an insulated gate type transistor (IGBT). In particular, since the electronic component 121 used for an inverter of an automobile and so on needs to deal with the large electric power, a power IGBT having a large amount of heat generation during operation is used. Although the power conversion device has a plurality of semiconductor elements, the semiconductor elements are illustrated as one electronic component 121 in FIGS. 2(a) and (b).

A back surface of the electronic component 121 is joined to a die 122a of the lead frame 122 by the bonding material 129 such as solder. The lead frame 122 is made of copper, aluminum or an alloy containing any one of those materials as a main component. The lead terminals 125a to 125c are members that are formed integrally with the lead frame 122 by molding a sheet metal, and separated by cutting the lead frame 122 after molding.

Although not shown, an input electrode to which an input signal is input, an output electrode from which an output signal is output, a control electrode that performs control for converting the input signal input from the input electrode into the output signal, and so on are formed on a main surface of the electronic component 121. The respective electrodes are bonded to the lead terminals 125a to 125c by wires 123 made of aluminum, gold, or the like. In other words, each of the lead terminals 125a to 125c includes functions of the input terminal, the control terminal, and the output terminal. The electronic component 121 and the lead frame 122 are bonded to each other by the wire 123 and configure a circuit body 500 having an inverter circuit (refer to FIG. 9) which will be described later.

The ground terminal 126 is formed of a conductive member and is insulated from all of the electronic component 121, the bonding material 129, the lead frame 122, and the heat sink 130. In other words, a periphery of the ground terminal 126 is covered with the sealing resin 170 in a state where a part of a front end side of the ground terminal 126 is exposed.

As with the lead terminals 125a to 125c, the ground terminal 126 can be integrally formed with the lead frame 122 by molding a sheet metal and can be formed by cutting and separating the lead frame 122 after molding. This configuration will be described later.

The thermally conductive insulating member 124 is interposed between the die 122a of the lead frame 122 and the heat sink 130, and is made of ceramics or an organic resin.

The heat sink 130 has a structure in which a plurality of cooling fins 130b arranged in a matrix or in a staggered manner are integrally formed on a plate-like main body 130a. The heat sink 130 is made of, for example, a metal containing aluminum, copper, magnesium or the like, ceramic having high thermal conductivity or a mixture of a metal and an inorganic material, or the like. An example of a method for efficiently forming the heat sink 130 is machining by slicing or dicing. A groove having a depth corresponding to a thickness of the cooling fins 130b is formed at predetermined intervals from a vertical direction and a horizontal direction with the use of a plate material having a thickness obtained by adding a thickness of the main body 130a and the thickness of the cooling fins 130b, to thereby form the heat sink 130. The processing of the grooves may be performed in such a manner that processing in a vertical direction and processing in a horizontal direction may be set to be orthogonal to each other or obliquely intersect with each other. The heat sink 130 may be formed through a method other than the machining. A clad material having different materials for the main body 130a and the cooling fins 130b may be used.

The sealing resin 170 is made of, for example, an epoxy resin or an organic resin material mixed with a filler such as silica in the epoxy resin.

As described above, the sealing resin 170 exposes the front end sides of the lead terminals 125a to 125c and the ground terminal 126, and one surface of the heat sink 130 to seal substantially the overall periphery of the electronic component structure 120. The sealing resin 170 covers the overall periphery of the lower end side of the ground terminal 126 so that the grounding terminal 126 is insulated from other conductive members (refer to FIG. 2B). An outer surface of the sealing resin 170 is substantially flush with upper surfaces of the cooling fins 130b of the heat sink 130 on a side surface on which the heat sink 130 is formed (refer to FIG. 3(b)).

The main body conductor layer 210 has a lower layer 211 and an upper layer 212 that is formed on the lower layer 211. The lower layer 211 and the upper layer 212 can be made of a metal material such as aluminum, tin, chromium, copper, nickel or the like. A copper-based metal having low electrical resistivity is preferable as the material of the lower layer 211 among those metal materials. The upper layer 212 is preferably made of a nickel based metal having high resistance under an operating environment such as oxidation resistance.

The ground conductor layer 220 is made of the same material as that of the lower layer 211 of the main body conductor layer 210. In other words, the ground conductor layer 220 has only the lower layer 211 of the main body conductor layer 210, but has no upper layer 212 of the main body conductor layer 210.

[Manufacturing Method of Electronic Module]

A manufacturing method of the electronic module 110 according to an embodiment will be described.

FIG. 3(a) is a cross-sectional view of the electronic component structure 120, FIG. 3(b) is a cross-sectional view for illustrating a next process in FIG. 3(a), and FIG. 3(c) is a diagram of a lead frame before cutting viewed from a top surface of FIG. 3(b).

First, the electronic component structure 120 is fabricated.

The die 122a and the lead terminals 125a to 125c are integrated into the lead frame 122. The electronic component 121 is bonded to one surface of the die 122a with a bonding material 129. The electronic component 121 is bonded to one surface of the die 122a with the bonding material 129. A soldering method using a solder as the bonding material 129 is preferable, but another method may be applied. Next, the respective lead terminals 125a to 125c of the lead frame 122 are bonded to electrodes (not shown) of the electronic component 121 with the wires 123. It is preferable to cut the lead frame 122 and separate the lead terminals 125a to 125c from the die 122a before the lead terminals 125a to 125c are bonded to the electrodes of the electronic component 121 by the wires.

In other words, as illustrated in FIG. 3(c), the lead frame 122 is formed in which the lead frame 125a is connected to the die 122a and the lead terminals 125b, 125c and the ground terminal 126 are separated from the die 122a. At that point, the other ends of the lead terminals 125a to 125c and the ground terminal 126 are connected to each other by a connecting portion 122b of the lead frame 122. Thereafter, the electronic component 121 is joined to the die 122a, and the electrodes (not shown) of the electronic component 121 are bonded to the die 122a, and the lead terminals 125b, 125c and the electrodes of the electronic component 121 are bonded to each other by the wires (in FIG. 3(c), the electronic component 121 and the wires 123 are indicated by dotted lines).

The insulating member 124 and the heat sink 130 are joined to a surface of the die 122a opposite to the surface to which the electronic component 121 is bonded. In the case where the insulating member 124 is made of a resin, it is preferable that the insulating member 124 is made of a thermosetting resin having high thermal conductivity. It is preferred that a resin having adhesiveness before complete curing is interposed between the heat sink 130 and the die 122a and thermocompression bonded to thermally cure the insulating member 124. This state is illustrated in FIG. 3(a).

Next, as illustrated in FIG. 3(b), the die 122a to which the electronic component 121 and the heat sink 130 are bonded, and the lead terminals 125a to 125c and the ground terminal 126 which are connected to the electronic component 121 by the wires 123 are installed in a metal mold not shown.

Next, the sealing resin 170 is formed by molding. A transfer molding method is a preferable method for molding. The groove 171 is formed in the sealing resin 170 during molding. Then, the lead frame 122 is cut by a cutting line c-c indicated by a two-dot chain line in FIG. 3(c) to separate the lead terminals 125a to 125c and the ground terminal 126 from each other.

In this way, the electronic module 110 is formed.

As illustrated in FIG. 3(a), in the above configuration, when the electronic component structure 120 is formed, the cooling fins 130b are formed on the heat sink 130. However, at that stage, the heat sink 130 may be formed as a plate-like member without the provision of the cooling fins 130b, the electronic component structure 120 may be sealed with a mold resin, the mold resin may be cured to form the sealing resin 170, and thereafter the cooling fin 130b may be formed. With the above procedure, since it is not necessary to take measures to prevent the mold resin from leaking from between the cooling fins 130b at the time of molding, the production can be made efficient.

Next, a method of forming the conductor layer 200 on the electronic module 110 will be described.

[Conductor Layer Forming Method 1]

FIG. 4(a) to (c) are cross-sectional views illustrating an example of a method of forming the conductor layer in the electronic module. The method of forming the conductor layer will be described with reference to an enlarged view of a region IV in FIG. 3(b).

In order to form the upper layer 212 of the main body conductor layer 210 on the sealing resin 170 by electroplating, a lower layer 211 to be a feeding film is required.

Therefore, first, as illustrated in FIG. 4(a), a lower underlayer 211a is formed by electroless plating. Because a liquid property of the electroless plating solution may corrode the heat sink 130 made of a metallic member, it is necessary to pay attention to this matter in the electroless plating solution. For that reason, for example, in the case where the heat sink 130, the lead terminals 125a to 125c, and the ground terminal 126 are made of an aluminum-based metal, it is preferable to use electroless nickel plating for forming the lower underlying layer 211a.

The lower underlying layer 211a may be formed on one surface of the heat sink 130 on the side of the cooling fins 130b and on the ground terminal 126. Alternatively, the lower underlying layer 211a may be formed on the sealing resin 170. In the present embodiment, an example in which the lower underlayer 211a is not formed on the sealing resin 170 is illustrated.

As illustrated in FIG. 4(b), an upper underlying layer 211b is formed on the lower underlying layer 211a and the sealing resin 170. The upper underlying layer 211b functions as a power feeding layer of made of electroplating (electrolytic plating) performed at the following step. The ground conductor layer 220 is connected to a body or a chassis of a vehicle not shown and serves as a flow path for a surge current. For that reason, it is preferable that the upper underlying layer 211b is made of copper-based metal having low electric resistivity such as copper or copper nickel alloy. The upper underlying layer 211b is formed by electroless plating on the sealing resin 170 including the upper surface 170a and on one overall surface of the heat sink 130 on the side of the cooling fins 130b, and the ground terminal 126 (refer to FIG. 6(b)). The lower underlying layer 211a and the upper underlying layer 211b configure the lower layer 211.

As illustrated in FIG. 4(c), the upper layer 212 is formed on the upper underlying layer 211b. The upper layer 212 is formed by electroplating using the upper underlying layer 211b as a power feeding layer. It is preferable that the upper layer 212 is made of a nickel-based metal high in cost and tolerance such as oxidation resistance under the use environment. The upper layer 212 is not formed in the ground terminal 126, and the ground conductor layer 220 formed of only the lower layer 211 including the lower underlying layer 211a and the upper underlying layer 211b is formed on the ground terminal 126. A thickness of the lower layer 211 is set to about several hundred nm and a thickness of the upper layer 212 is set to about several μm.

The upper layer 212 can be formed by electroless plating. Even in the case where the upper layer 212 is formed by electroless plating, the formation of the upper underlying layer 211b makes it possible to improve a deposition property of the plating metal at the time of electroless plating.

The upper layer 212 is formed on the lower layer 211 including the lower underlying layer 211a and the upper underlying layer 211b to form the main body conductor layer 210.

[Conductor Layer Forming Method 2]

FIGS. 5(a) and 5(b) are cross-sectional views illustrating a second example of a method of forming a conductive layer in an electronic module.

As illustrated in FIG. 5(a), in a second method of forming the conductor layer 200, the lower layer 211 is formed by sputtering or evaporation. The lower layer 211 is formed on the sealing resin 170 and on one entire surface of the heat sink 130 on the side of the cooling fin 130b. The lower layer 211 is also formed on the ground terminal 126. The lower layer 211 is preferably made of a copper-based material. It is preferable that a thickness of the lower layer 211 is set to 0.1 μm or more. When an adhesive force between the sealing resin 170 and the heat sink 130 and the copper-based metal is insufficient, titanium and chromium may be sputtered or evaporated as an underlying metal before the formation of the copper-based metal. A thickness of the underlying metal may be set to about 30 to 130 nm.

As illustrated in FIG. 5(b), the upper layer 212 is formed on the lower layer 211. The upper layer 212 is formed by electroplating with the use of the lower layer 211 as a power feeding layer. The upper layer 212 is not formed on the ground terminal 126, but the ground conductor layer 220 configured by only the lower layer 211 is formed on the ground terminal 126. The upper layer 212 is formed on the lower layer 211, to thereby form the main body conductor layer 210. The upper layer 212 can be made of a nickel-based metal in consideration of a tolerance such as oxidation resistance under the use environment.

The upper layer 212 can also be formed by electroless plating. Even when the upper layer 212 is formed by electroless plating, the formation of the lower layer 211 makes it possible to improve a precipitation property of the plating metal during electroless plating.

In any of the abovementioned methods exemplified as the method of forming the conductor layer, in order to insulate the lead terminals 125a to 125c from the conductor layer 200, there is a need to prevent the conductor layer 200 from being formed in the periphery of root portions of the lead terminals 125a to 125c of the sealing resin 170.

Next, a method for preventing the conductive layer 200 from being formed in the periphery of the root portions where the lead terminals 125a to 125c of the sealing resin 170 are disposed will be described.

[Method of Attaching and Removing Conductor Layer with Respect to Lead Terminal]

A method of preventing adhesion of the conductor layer 200 to the lead terminals 125a to 125c will be described with reference to FIGS. 6(a) and (b) to FIGS. 7(a) and (b).

FIG. 6(a) is a top view of the electronic module that has been subjected to electroless plating, and FIG. 6(b) is an external perspective view for illustrating a process subsequent to a process in FIG. 6(a). In addition, FIG. 7(a) is a top view of the electronic module for illustrating a process subsequent to the process of FIG. 6(b), and FIG. 7(b) is a top view of the electronic module for illustrating a process subsequent to the process of FIG. 7(a).

First, as illustrated in FIG. 6(a), the lower layer 211 of the conductor layer 200 is formed on the entire surface of the electronic module 110. In other words, the lower layer 211 is formed on the sealing resin 170, on one surface of the heat sink 130 on the cooling fins 130b side, and on the entire surfaces of the ground terminal 126 and the lead terminals 125a to 125c in a portion exposed from the sealing resin 170.

The formation of the lower layer 211 can be performed by a method of forming the lower underlying layer 211a and the upper layer underlying layer 211b by the electroless plating exemplified as the method 1 of forming the conductor layer, or a method of forming a single layer of the lower layer 211 by sputtering or vapor deposition exemplified as the method 2 of forming the conductor layer.

Next, as illustrated in FIG. 6(b), the portions of the lead terminals 125a to 125c exposed from the sealing resin 170 are covered with a mask jig 401. An elastic material 402 is disposed at a lower end of the mask jig 401, and the sealing member 402 is pressed against the upper surface 170a of the sealing resin 170 by the mask jig 401. The mask jig 401 has a size that covers the entirety of the lead terminals 125a to 125c in the illustrated example. Alternatively, three separated mask jigs covering the respective lead terminals 125a to 125c may be employed.

In this state, as illustrated in FIG. 7(a), the upper layer 212 is formed by electroplating with the use of the lower layer 211 as a power feeding layer. Electroplating is performed in a state where the electronic module 110 is immersed in a plating solution so that an upper surface 170a of the sealing resin 170 is slightly sunk below an upper surface of the plating solution. The electroplating is performed in this manner, as a result of which the main body conductor layer 210 including the lower layer 211 and the upper layer 212 is formed on one surface of the heat sink 130 on the cooling fins 130b side and the entirety of the sealing resin 170 including the upper surface 170a. In addition, the ground conductor layer 220 configured by only the lower layer 211 is formed on the ground terminal 126. In that case, since the electroplating is performed in a state where the upper surface 170a of the sealing resin 170 is immersed in the plating solution so as to slightly sink below the upper surface of the plating solution, the ground terminal 126 is plated with as large a height as the thickness portion of the upper layer 212 as illustrated in FIG. 2(b), and the amount of the plating material can be saved.

Next, the mask jig 401 is removed to expose the lead terminals 125a to 125c. Then, the lower layer 211 formed on the exposed lead terminals 125a to 125c is removed. In other words, the lower layer 211 formed on the lead terminals 125a to 125c is removed with the use of the upper layer 212 as a mask. This state is illustrated in FIG. 7(b). The removal of the lower layer 211 may be performed by dry etching or wet etching. Since a thickness of the upper layer 212 is thicker than the thickness of the lower layer 211, the lower layer 211 may be etched with the upper layer 212 as a mask, and the etching may be terminated when the overall lower layer 211 has been removed. The etching is performed to remove the lower layer 211 formed on the upper surface 170a of the sealing resin 170 in the periphery of the lead terminals 125a to 125c together with the lower layer 211 formed on the lead terminals 125a to 125c. As a result, the respective lead terminals 125a to 125c are electrically insulated from the conductor layer 200.

In the above method, the lower layer 211 is formed on the entire upper surface 170a of the sealing resin 170, the upper layer 212 is formed on the lower layer 211 excluding the peripheral portion of the root portion of the sealing resin 170 in which the lead terminals 125a to 125c are disposed, and thereafter the lower layer 211 of the root portion of the lead terminals 125a to 125c is removed.

On the other hand, a method in which the lower layer 211 and the upper layer 212 are not formed on the peripheral portion of the root portion where the lead terminals 125a to 125c of the sealing resin 170 are arranged can be applied. Hereinafter, the method will be described.

[Method for Preventing Attachment of Conductive Layer to Lead Terminal]

FIG. 8(a) is an external perspective view of the electronic module for illustrating a process before performing the electroless plating, FIG. 8(b) is a top view of the electronic module for illustrating a process subsequent to the process in FIG. 8(a), and FIG. 8(c) is a top view of the electronic module for illustrating a process subsequent to the process of FIG. 8(b).

First, as illustrated in FIG. 8(a), the lead terminals 125a to 125c exposed from the sealing resin 170 are covered with the mask jig 401. An elastic material 402 is disposed at a lower end of the mask jig 401, and the sealing material 402 is pressure-bonded to the upper surface 170a of the sealing resin 170 by the mask jig 401.

In this state, as illustrated in FIG. 8(b), the lower layer 211 is formed on the surface of the sealing resin 170, one surface of the heat sink 130 on the cooling fin 130b side, and the overall surface of the ground terminal 126 exposed from the sealing resin 170. The formation of the lower layer 211 can be performed by a method of forming the lower underlying layer 211a and the upper layer underlying layer 211b by the electroless plating exemplified as the method 1 of forming the conductor layer, or a method of forming a single layer of the lower layer 211 by sputtering or vapor deposition exemplified as the method 2 of forming the conductor layer.

In the case where the lower underlying layer 211a and the upper underlying layer 211b are formed by electroless plating, there is no need to immerse the entire electronic module 110 in the plating solution, and the upper front end side of the ground terminal 126 may be exposed from a plating solution. In other words, the lower underlying layer 211a and the upper underlying layer 211b may be formed up to an intermediate position between the root portion and the front end portion of the ground terminal 126.

As illustrated in FIG. 8(c), the upper layer 212 is formed by electroplating with the use of the lower layer 211 as a power feeding layer. Electroplating is performed in a state where the electronic module 110 is immersed in the plating solution so that the upper surface 170a of the sealing resin 170 is slightly sunk below the upper surface of the plating solution. The electroplating is performed in this manner, as a result of which the main body conductor layer 210 including the lower layer 211 and the upper layer 212 is formed on one surface of the heat sink 130 on the cooling fins 130b side and the entirety of the sealing resin 170 including the upper surface 170a. In addition, the ground conductor layer 220 configured by only the lower layer 211 is formed on the ground terminal 126.

Thereafter, the mask jig 401 is removed.

In the above configuration, a method in which in order to prevent the lower layer 211 or the upper layer 212 from being formed on the peripheral portions of the root portions of the lead terminals 125a to 125c on the lead terminals 125a to 125c and the upper surface 170a of the sealing resin 170, the lead terminals 125a to 125c are covered with the mask jig 401 provided with the sealing material 402 is exemplified. Alternatively, the peripheral portion of the root portion of the sealing resin 170 in which the lead terminals 125a to 125c and the lead terminals 125a to 125c are disposed may be covered with clay or gypsum.

After the main body conductor layer 210 has been formed in the electronic module 110, an O-ring is set in the groove 171. Alternatively, the sealing member 181 is press-fitted into the groove 171 of the sealing resin 170. As a result, the electronic device 100 illustrated in FIG. 1 is formed.

[Example of Circuit Configuration of Circuit Body]

FIG. 9(a) is a circuit diagram as one example of the circuit body according to the present invention, and FIG. 9(b) is a timing chart of input/output signals of the circuit body.

The circuit body 500 includes, for example, an inverter circuit as illustrated in the figure. The circuit body 500 includes transistors 501 to 504 such as IGBTs and a DC power supply 520, and an output terminal of the circuit body 500 is connected to a load 519. The transistors 501 to 504 operate as switching elements. When the transistor 501 and the transistor 504 are turned on at the same time, an output voltage Vo becomes the same voltage E(v) as a DC power supply 520 (refer to FIG. 9(b)-(1)). When the transistor 502 and the transistor 503 are turned on at the same time, the output voltage Vo becomes −E (v) (refer to FIG. 9(b)-(2)). In a state where all of the transistors 501 to 504 are off, the output voltage Vo becomes 0 (v).

The on/off operation of the transistors 501 to 504 is controlled to output a drive waveform illustrated in FIG. 9(b)-(3). Further, fine control is performed, thereby being capable of approximating an AC waveform.

Normally, each of the transistors 501 to 504 is mounted with a collector electrode facing the die 122a side of the lead frame 122 and the gate electrode and the emitter electrode facing the opposite side. In the mounting structure, the collector electrode is electrically connected to the die 122a of the lead frame 122 through the bonding material 129.

The ground terminal 126 is connected to a body, a chassis or the like of a vehicle having a ground potential. The ground terminal 126 is electrically connected to the heat sink 130 through the ground conductor layer 220 and the main body conductor layer 210. The insulating member 124 is interposed between the die 122a of the lead frame 122 and the heat sink 130, as a result of which the collector electrode of each of the transistors 501 to 504 is insulated from the grounded portion, and an output signal illustrated in FIG. 9(b)-(3) is supplied to a load 519.

Figure 10:
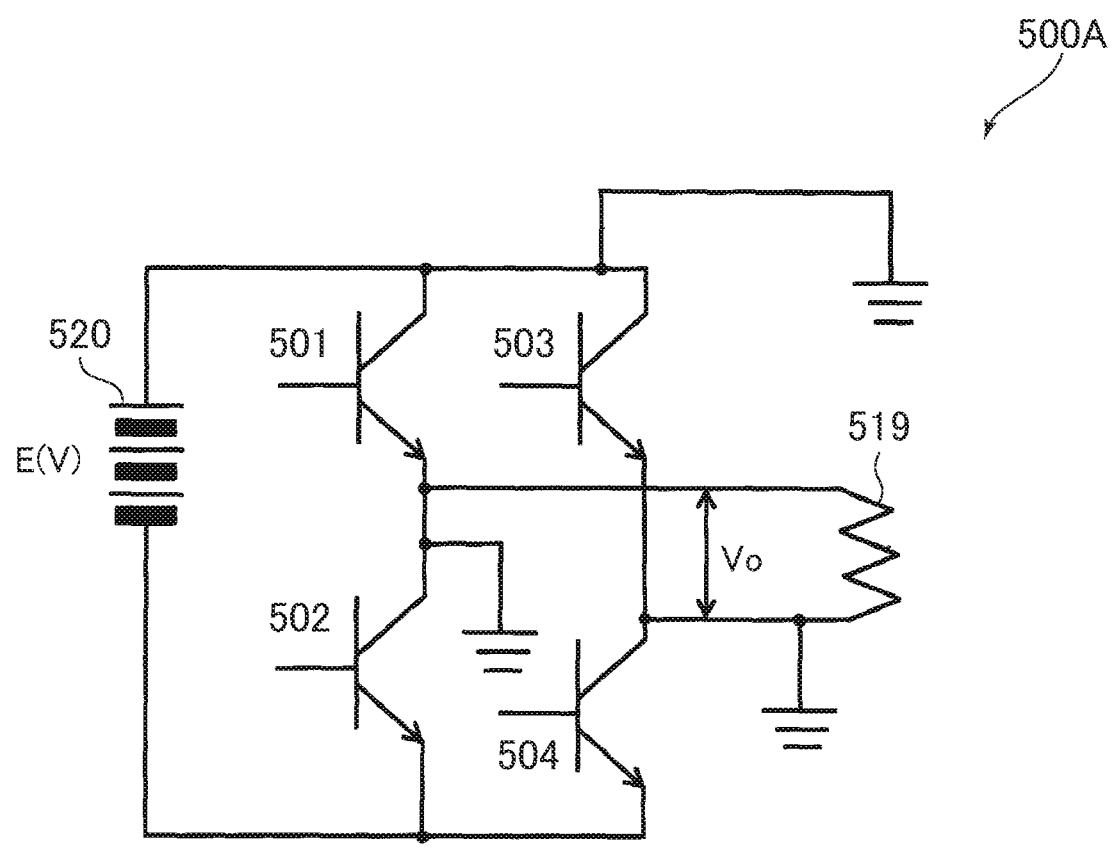
FIG. 10 is a circuit diagram of a circuit body in a comparative example.

FIG. 10 is a circuit diagram of a circuit body 500A in a comparative example.

In the circuit body 500A of the comparative example, the insulating member 124 is not interposed between the die 122a of the lead frame 122 and the heat sink 130. Even in this case, the ground terminal 126 is electrically connected to the heat sink 130 through the body conductor layer 210 and the main body conductor layer 210, and the ground terminal 126 is connected to the body, chassis, or the like of the vehicle and grounded. In the above circuit body 500A, as shown in the figure, the collector electrodes of the transistors 501 to 504 are grounded through the die 122a of the lead frame 122, the heat sink 130, the main body conductor layer 210, the ground conductor layer 220, and the ground terminal 126. For that reason, even when the transistor 501 and the transistor 504 are turned on at the same time, and even when the transistor 502 and the transistor 503 are turned on at the same time, the output voltage Vo has the same potential as the ground potential. In other words, no AC waveform is obtained.

From the above viewpoint, there is a need to insulate the transistors 501 to 504 of the circuit body 500 from the main body conductor layer 210 and the ground conductor layer 220.

According to the electronic device according to the first embodiment of the present invention, the following advantages are obtained.

(1) The electronic component structure 120 including the circuit body 500 and the heat sink 130 was sealed with the sealing resin 170, and the conductor layer 200 was formed on one surface of the heat sink 130 and the sealing resin 170. Also, a power feeding line of the circuit body 500 was insulated from the heat sink 130, the ground terminal 126 is provided in the electronic component structure 120, and the ground terminal 126 was electrically connected to the conductor layer 200. For that reason, the ground terminal 126 is grounded, thereby being capable of suppressing the surge voltage generated when the circuit body 500 performs switching operation.

(2) The conductor layer 200 includes the main body conductor layer formed on one surface of the heat sink 130 and the sealing resin 170, and the ground conductor layer 220 formed on the ground terminal 126. The ground conductor layer 220 is configured by the lower layer 211 smaller in the electric resistivity and has no upper layer 212 large in the electric resistivity. For that reason, when the ground conductor layer 220 is grounded, a resistance value of the connection portion is reduced, and the surge voltage reduction efficiency is enhanced.

(3) The main body conductor layer 210 has the upper layer 212 made of a nickel-based metal or the like having the high tolerance such as the oxidation resistance under the use environment, which was formed on the lower layer 211 having low electric resistivity. For that reason, the production cost of the plating layer can be reduced and reliability for the use environment can be increased.

(4) The lower layer 211 of the conductor layer 200 was configured by forming the lower underlying layer 211a made of electroless nickel plating and forming the upper underlying layer 211b made of a copper-based metal having low electric resistivity on the lower underlying layer 211a by electroless plating. For that reason, even when the heat sink 130, the conductive leads (lead terminals) 125a to 125c, or the ground terminal 126 are made of an aluminum-based metal, those components can be restrained from being corroded by the electrolytic plating solution of the copper-based metal.

(5) The lower layer 211 made of a copper-based metal was formed on the heat sink 130 by sputtering or vapor deposition. In this method, even when the heat sink 130, the conductive leads 125a to 125c, or the ground terminal 126 are made of the aluminum-based metal, since the lower layer 211 can be formed directly without interposing any other metallic material, production efficiency can be improved.

(6) In the case where an adhesion between the heat sink 130 or the sealing resin 170 and the copper-based sputtering or the vapor deposition layer is insufficient, the reliability of bonding can be improved by interposing an underlying metal such as titanium or chromium.

(7) The lower layer 211 of the conductor layer 200 is formed on the entire electronic module 110, the upper layer 212 is formed in a state where the peripheral portion of the root portion of the sealing resin 170 in which the lead terminals 125a to 125c and the lead terminals 125a to 125c are disposed is covered with the mask jig 401. Thereafter, the lower layer 211 in the periphery of the root portion of the sealing resin 170 in which the lead terminals 125a to 125c are arranged is removed with the use of the upper layer 212 as a mask. Since the lower layer 211 in the peripheral portion of the root portion of the sealing resin in which the lead terminals 125a to 125c are disposed is removed with the use of the upper layer 212 as the mask, the working efficiency is improved.

(8) The lower layer 211 and the upper layer 212 of the conductor layer 200 are formed after the lead terminals 125a to 125c have been covered with the mask jig 401. In this method, since a process of removing the lower layer 211 of the conductor layer 200 is not required, and the number of processes is reduced, the working efficiency can be further improved.

Second Embodiment

Figure 11:
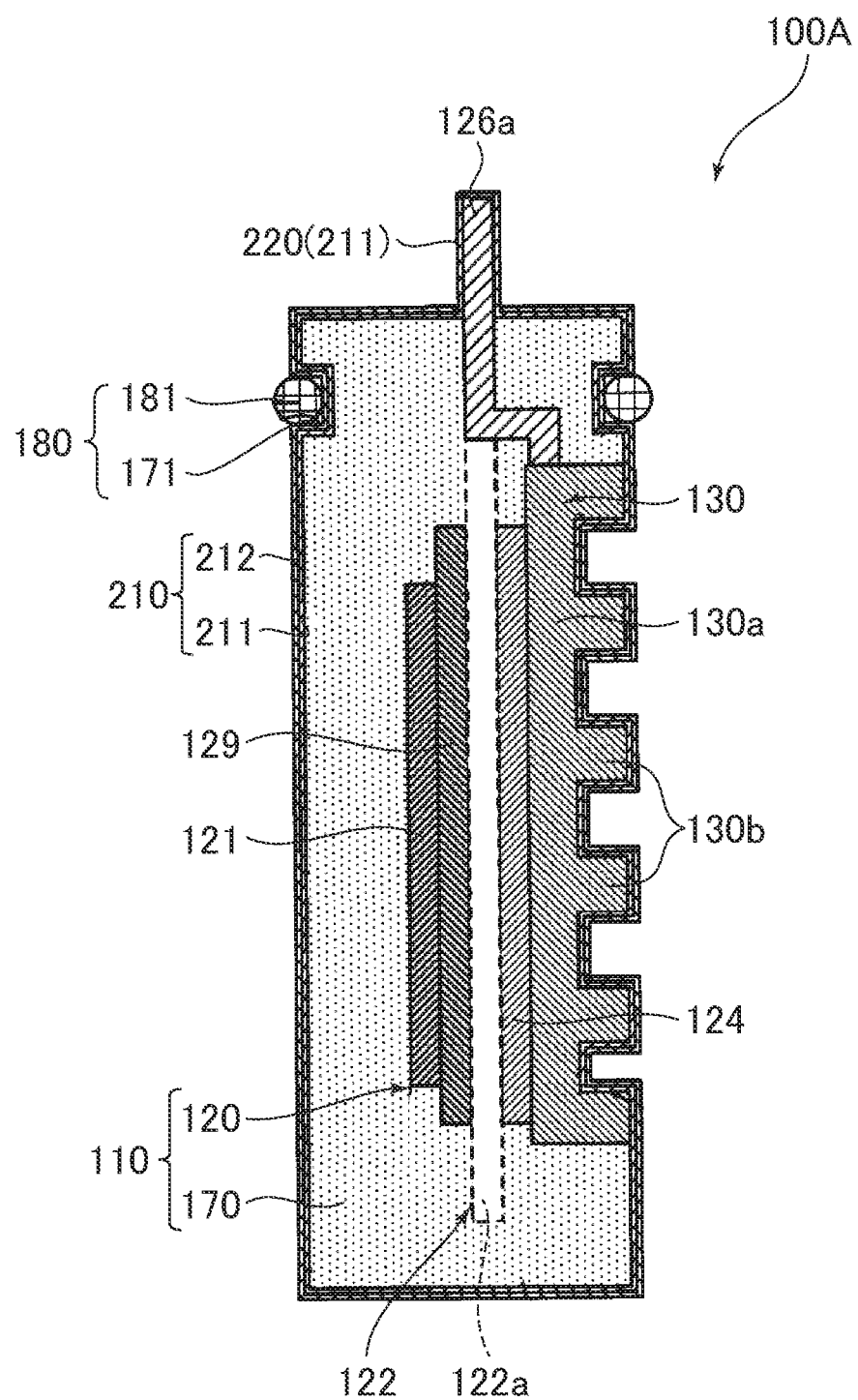
FIG. 11 is a cross-sectional view of an electronic device according to a second embodiment of the present invention.

FIG. 11 is a cross-sectional view of an electronic device according to a second embodiment of the present invention.

An electronic device 100A according to the second embodiment is different from the electronic device 100 of the first embodiment in that a ground terminal 126a is electrically connected to a heat sink 130.

The configuration in which the ground terminal 126a is linearly arranged on the upper surface 170a of the sealing resin 170 together with the lead terminals 125a to 125c is the same as that of the electronic device 100 of the first embodiment.

The ground terminal 126a according to the second embodiment is bent toward the heat sink 130 side in a portion embedded in the sealing resin 170, and an end of the ground terminal 126a is electrically connected to the heat sink 130 by soldering, welding or the like.

Other configurations of the electronic device 100A according to the second embodiment are the same as those of the electronic device 100 according to the first embodiment, and corresponding members are denoted by the same reference numerals, and a description thereof is omitted.

Also in the second embodiment, the same advantages as those in the first embodiment are exerted.

In the second embodiment, since the ground terminal 126a is also electrically connected to the heat sink 130, a suppression of the surge voltage is more reliable.

Third Embodiment

Figure 12:
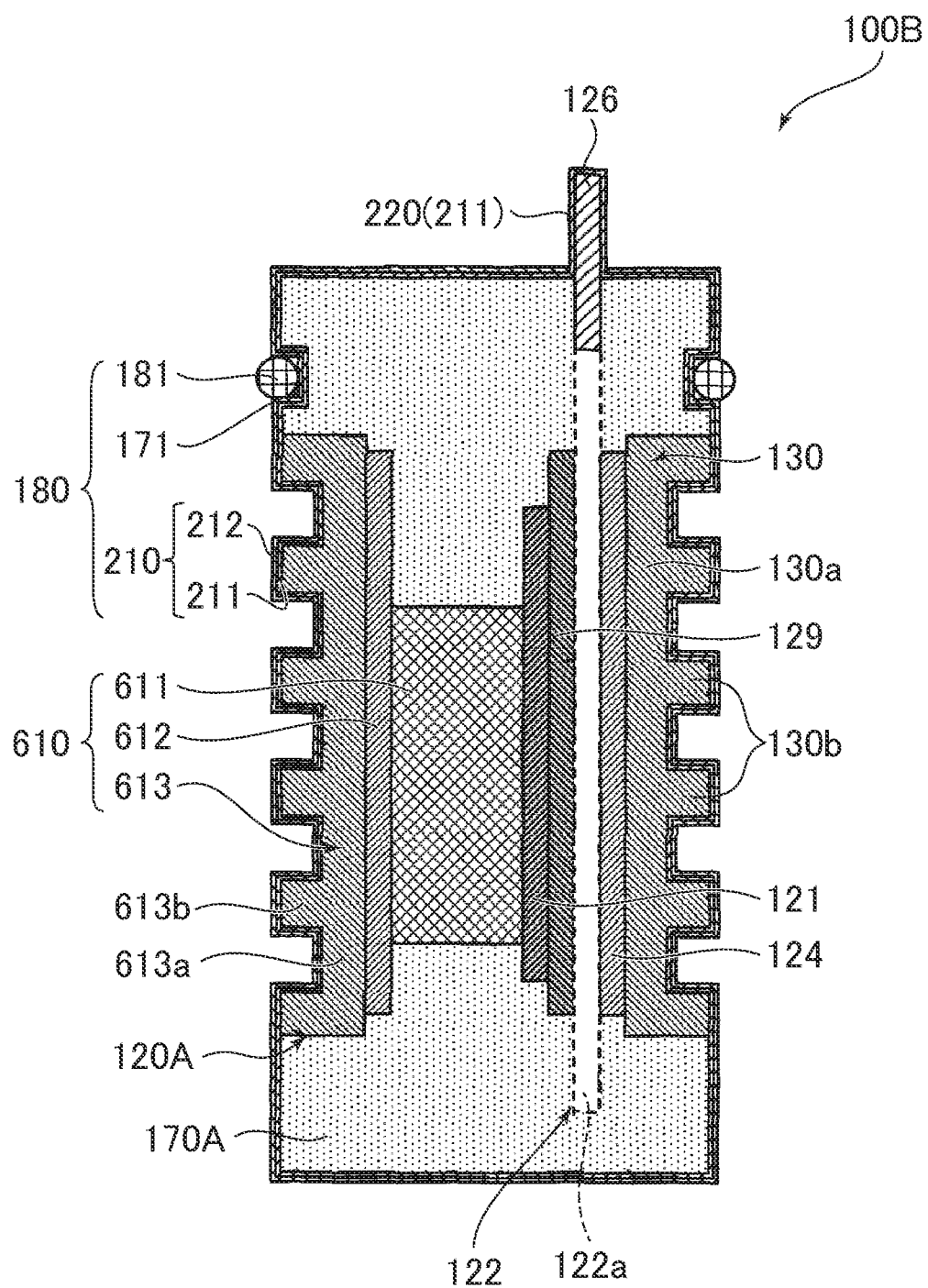
FIG. 12 is a cross-sectional view of an electronic device according to a third embodiment of the present invention.

FIG. 12 is a cross-sectional view of an electronic device according to a third embodiment of the present invention.

An electronic device 100B according to the third embodiment will mainly be described with respect to differences from the electronic device 100 according to the first embodiment.

The electronic device 100B according to the third embodiment includes a facing radiation structure portion 610 on a side opposite to a heat sink 130 in an electronic component 121. The facing heat radiation structure portion 610 includes an intermediate heat transfer member 611, a facing insulating member 612, and a facing heat sink 613.

The intermediate heat transfer member 611 is made of a high heat conductive metal such as copper or an aluminum based metal or ceramics such as alumina. The facing insulating member 612 is the same member as that of the insulating member 124 and made of ceramics or an organic resin. The facing heat sink 613 is the same member as that of the heat sink 130 and includes a main body 613a and cooling fins 613b. The intermediate heat transfer body 611 is interposed between the electronic component 121 and the facing insulating member 612, one surface of the intermediate heat transfer body 611 is thermally coupled to one surface of the electronic component 121, and the other surface of the intermediate heat transfer body 611 is thermally coupled to one surface of the facing insulating member 612. The electronic component 121 includes a transistor such as an IGBT, and an emitter electrode not shown is thermally coupled to the intermediate heat transfer body 611. As described above, a cathode electrode of the transistor is thermally coupled to a die 122a of a lead frame 122 through a bonding material 129.

Therefore, an electronic component structure 120A according to the third embodiment has a structure in which the facing heat sink 610 is thermally coupled to the electronic component 121 of the electronic component structure 120 according to the first embodiment. The sealing resin 170A seals the electronic component structure 120A so as to expose one surface of the heat sink 130, one surface of the facing heat sink 613, front end sides of the lead terminals 125a to 125c and the ground terminal 126.

Since other configurations of the electronic device 100B according to the third embodiment are the same as those of the electronic device 100 according to the first embodiment, the corresponding members are denoted by the same reference numerals, and a description thereof will be omitted.

Also in the electronic device 100B according to the third embodiment, the same advantages as those of the electronic device 100 according to the first embodiment are obtained. In addition, in the electronic device 100B according to the third embodiment, since the heat sinks 130 and 613 are provided on both sides of the electronic component 121, the heat radiation effect of the electronic component 121 can be enhanced.

Fourth Embodiment

Figure 13:
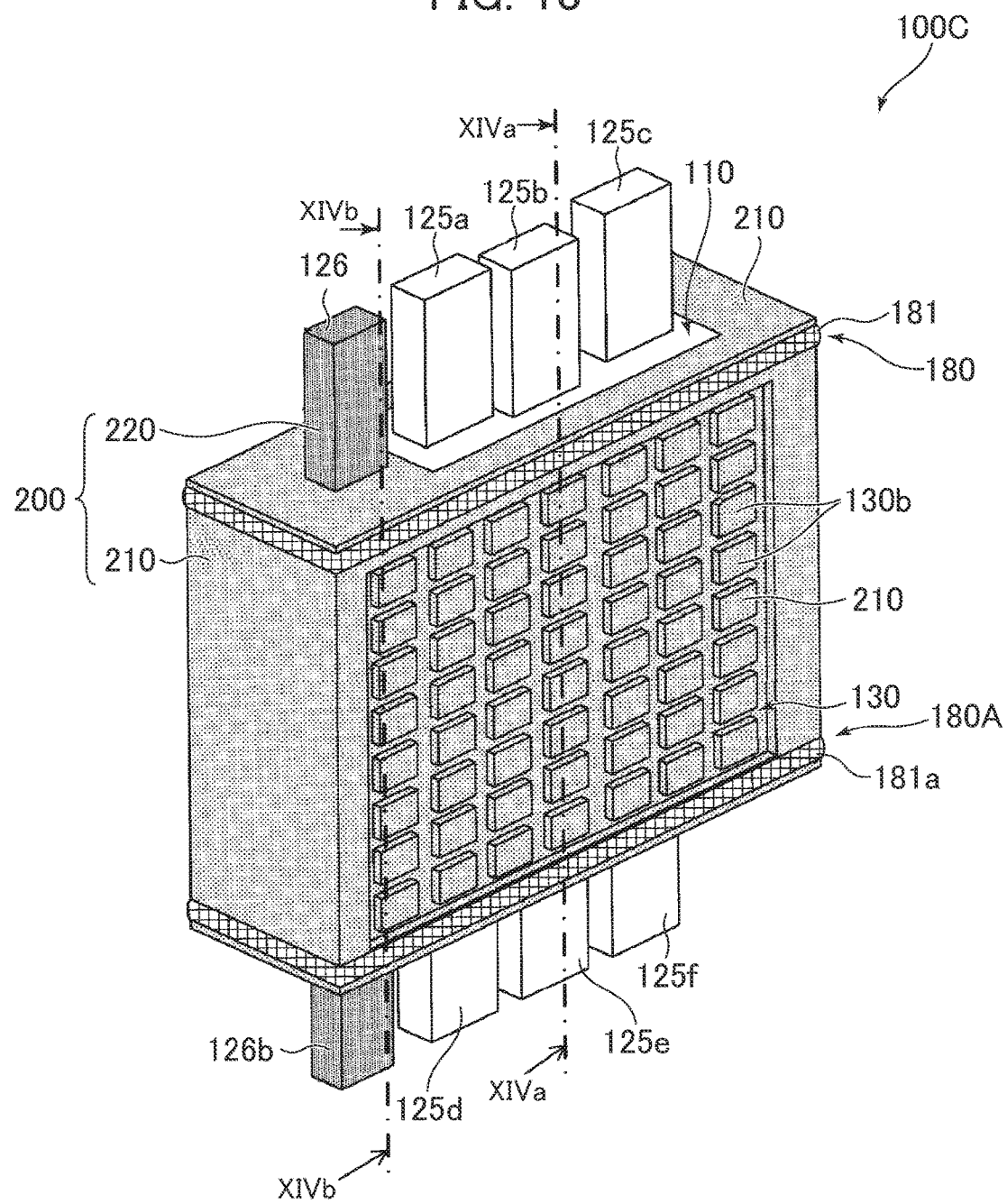
FIG. 13 is a cross-sectional view of an electronic device according to a fourth embodiment of the present invention.
Figure 14:
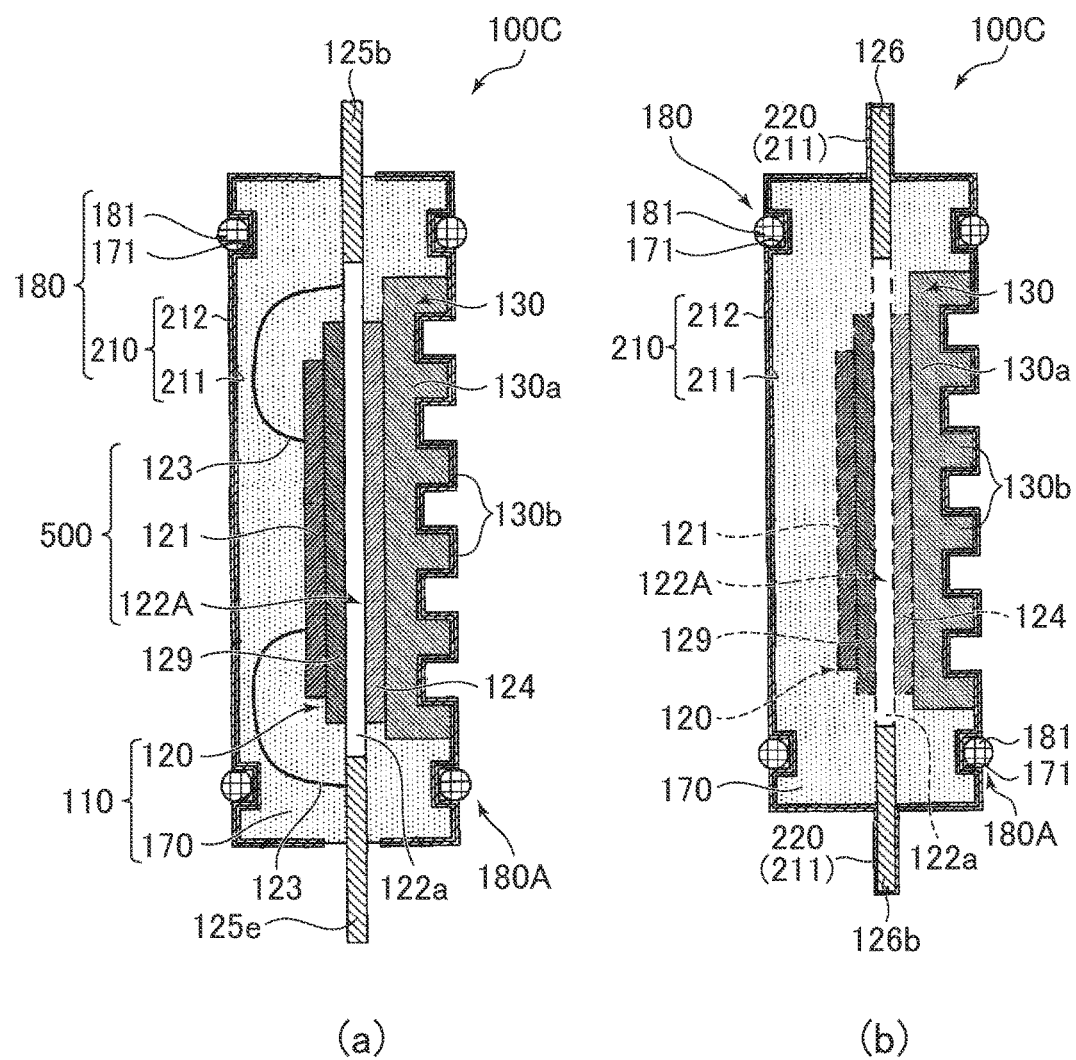
FIG. 14(*a*) is a cross-sectional view taken along a line XIVa-XIVa of FIG. 13, and FIG. 14(*b*) is a cross-sectional view taken along a line XIVb-XIVb of FIG. 13.

FIG. 13 is a cross-sectional view of an electronic device according to a fourth embodiment of the present invention. FIG. 14(a) is a cross-sectional view taken along a line XIVa-XIVa of FIG. 13 and FIG. 14(b) is a cross-sectional view taken along a line XIVb-XIVb of FIG. 13.

In an electronic device 100C according to a fourth embodiment, a sealing portion 180A similar to the sealing portion 180 provided on an upper side is also provided on a lower side. The sealing portion 180A includes a groove 171 provided in a sealing resin 170, a main body conductor layer 210 formed in the groove 171, and a sealing member 181. The electronic device 100C according to the fourth embodiment is installed in a flow path forming body not shown such that upper and lower ends of the electronic device 100C are arranged outside a cooling flow path through which a refrigerant flows, in other words, a central region between the sealing portion 180 and the sealing portion 180A is immersed in a cooling medium.

Lead terminals 125d to 125f are formed on a lower surface side of the electronic module 110 so as to protrude from the sealing resin 170, as with the lead terminals 125a to 125c formed on the upper surface side of the electronic module 110 so as to protrude from the sealing resin 170. The respective lead terminals 125d to 125f are connected to a die 122a of a lead frame 122 by wires 123. The lead terminals 125d to 125f are insulated from the conductor layer 200 as with the lead terminals 125a to 125c.

In addition, similarly to the ground terminal 126 formed on the upper surface side of the electronic module 110 so as to protrude from the sealing resin 170, a ground terminal 126b is formed on the lower surface side of the electronic module 110 so as to protrude from the sealing resin 170. Like the ground terminal 126, the ground terminal 126b is insulated from the lead frame 122, the electronic component 121, the bonding material 129, and so on. In FIG. 13, the grounding terminals 126 and 126b are illustrated in a state of being insulated from the heat sink 130. Alternatively, as in the second embodiment illustrated in FIG. 11, both or one of the ground terminals 126 and 126b may be electrically connected to the heat sink 130.

A ground conductor layer 220 is formed on the ground terminal 126b similarly to the ground terminal 126. The ground conductor layer 220 is made of the same material as that of the lower layer 211 of the body conductor layer 210 and is electrically connected to the body conductor layer 210.

The other structure in the fourth embodiment is the same as that in the first embodiment, and the corresponding members are denoted by the same reference numerals, and a description thereof will be omitted.

Therefore, also in the fourth embodiment, the same advantages as those in the first embodiment are obtained.

Fifth Embodiment

Figure 15:
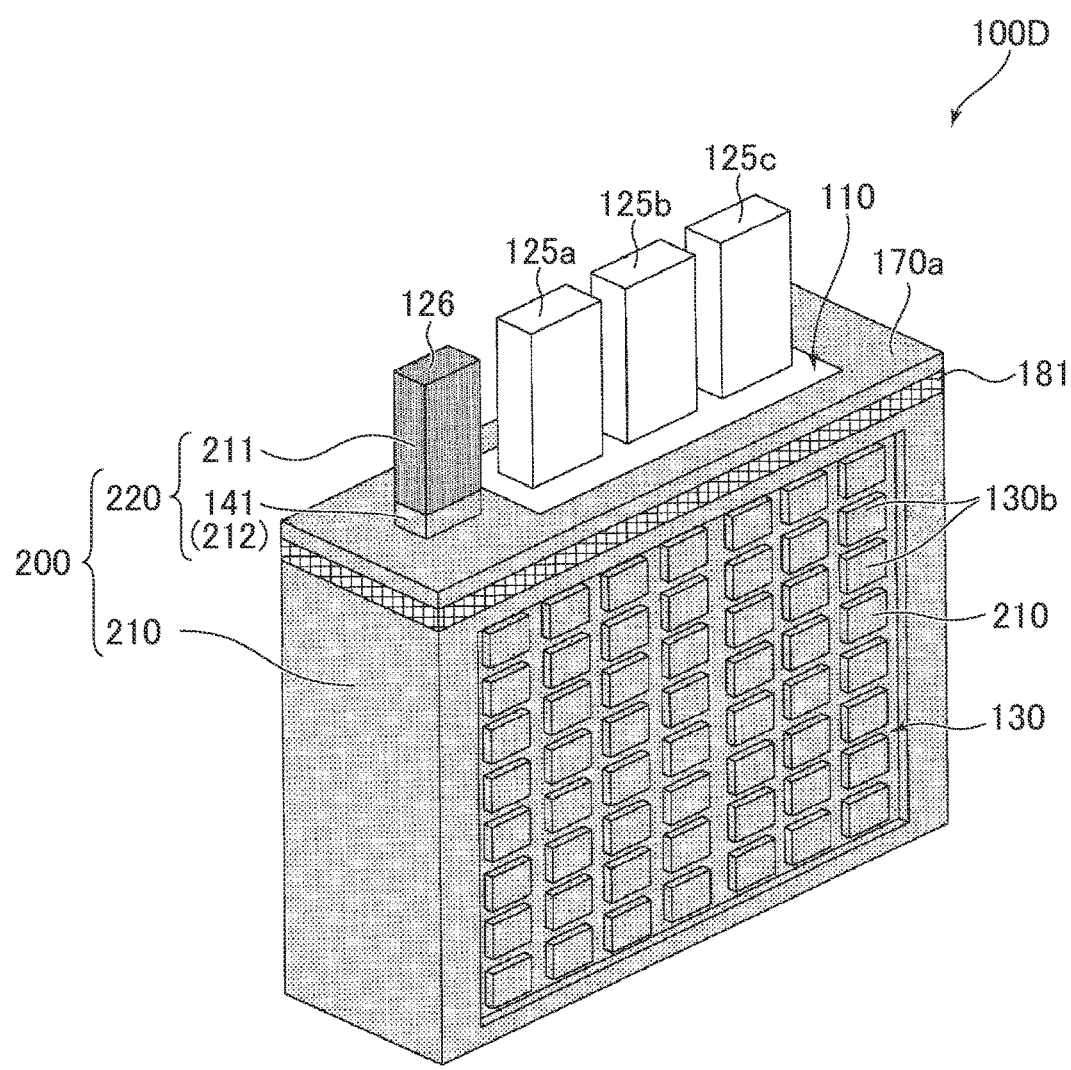
FIG. 15 is an external perspective view of an electronic device according to a fifth embodiment of the present invention.

FIG. 15 is an external perspective view of an electronic device according to a fifth embodiment of the present invention.

In an electronic device 100D according to the fifth embodiment illustrated in FIG. 15, a root portion 141 of a ground terminal 126 has the same configuration as that of a main body conductor layer 210. As described above, the main body conductor layer 210 includes a lower layer 211 and an upper layer 212.

The lower layer 211 is formed on the entire outer surface of the electronic module 110 including an outer surface of the ground terminal 126 and the upper layer 212 is formed on the lower layer 211. In the first embodiment, when the upper layer 212 is formed, electroplating is performed in a state where the electronic module 110 is immersed in a plating solution so that the upper surface 170a of the sealing resin 170 slightly sinks below the upper surface of the plating solution. In that method, since the upper layer 212 is not formed in the root of the ground terminal 126, the amount of plating material can be saved. However, it is also conceivable that a connection between the lower layer 211 and the upper layer 212 at the root of the ground terminal 126 becomes unstable.

Therefore, in the fifth embodiment, when the upper layer 212 is formed, the electroplating is performed in a state where the electronic module 110 is immersed in the plating solution up to the root portion 141 of the ground terminal 126. As a result, the root portion 141 of the ground terminal 126 is formed in the same plating layer structure as that of the main body conductor layer 210.

The other structures in the fifth embodiment are the same as those in the first embodiment, and corresponding members are denoted by the same reference numerals, and a description thereof will be omitted.

Therefore, the fifth embodiment also has the same configuration as that of the first embodiment. In the fifth embodiment, in particular, an electrical connection between the lower layer 211 and the upper layer 212 of the ground terminal 126 can be performed more reliably.

In the electronic devices 100A to 100C according to the second to fourth embodiments, the structure of the electronic device 100D according to the fifth embodiment can also be applied.

Sixth Embodiment

Figure 16:
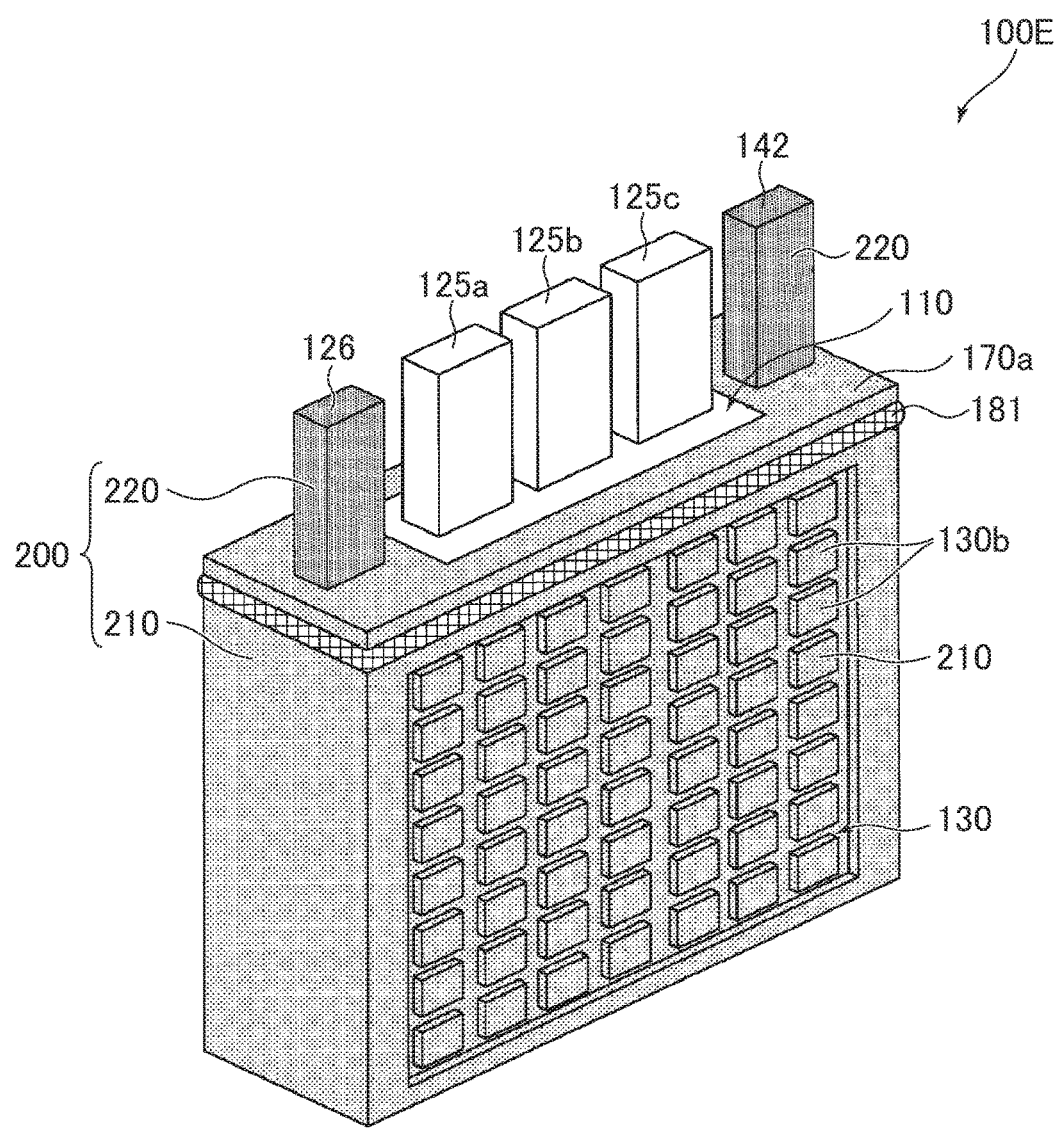
FIG. 16 is an external perspective view of an electronic device according to a sixth embodiment of the present invention.

FIG. 16 is an external perspective view of an electronic device according to a sixth embodiment of the present invention.

An electronic device 100E according to the sixth embodiment illustrated in FIG. 16 includes a plurality of (two in FIG. 16) ground terminals 126 and 142.

A ground conductor layer 220 is formed on each of the ground terminals 126 and 142. The ground terminals 126 and 142 are provided so as to face the longitudinal end of an upper surface 170a of a sealing resin 170. As in the respective embodiments described above, the ground conductor layer 220 is formed integrally with a lower layer 211 of a main body conductor layer 210 and does not have an upper layer 212 of the main body conductor layer 210.

The rest of the structure of the electronic device 100E according to the sixth embodiment is the same as that of the first embodiment, and corresponding members are denoted by the same reference numerals, and a description thereof will be omitted.

Also, in the sixth embodiment, the same advantages as those of the first embodiment are exerted. In particular, since the sixth embodiment has the plurality of grounding terminals 126 and 142, the surge voltage can be more reliably suppressed.

Also, in the second to fifth embodiments, the structure of the sixth embodiment can be applied.

In the respective embodiments described above, the ground terminal 126 is provided on the upper surface 170a of the sealing resin 170. Alternatively, the ground terminal 126 may be provided on the other side surface of the sealing resin 170. However, it is preferable to provide the ground terminal 126 outside the sealing portion 180.

In the respective embodiments described above, the electronic component 121 is mounted on the lead frame 122. However, the member on which the electronic component 121 is mounted is not limited to the lead frame 122, but may be configured by another supporting member having thermal conductivity.

In the respective embodiments described above, the ground conductor layer 220 is formed on the entire surface of the ground terminals 126, 126a, 126b, 142. Alternatively, the ground conductor layer 220 may be formed in only a part of the root side of the ground terminals 126, 126a, 126b, and 142.

In the respective embodiments described above, in order to prevent the upper layer 212 from being formed on the ground terminal 126, after the lower layer 211 was formed on the ground terminal 126, the electronic module 110 was immersed in a plating layer so that the ground terminal 126 protrudes from the plating layer and electroplated. Alternatively, the ground terminal 126 may be immersed in the plating solution in a state of being covered with the mask jig as with the lead terminals 125a to 125c and then electroplated.

In the respective embodiments described above, the upper layer 212 is not formed in at least a part of the ground terminals 126, 126a, 126b, and 142. However, the overall surfaces of the ground terminals 126, 126a, 126b, and 142 may be covered with the upper layer 212.

In the respective embodiments described above, the heat sink 130 has the cooling fins 130b. However, the heat sink 130 may not have the cooling fins 130b.

In the respective embodiments described above, the insulating member 124 was bonded directly to the heat sink 130. However, an intermediate heat transfer plate not shown may be joined to the heat sink 130, and the insulating member 124 may be joined to the intermediate heat transfer plate.

In the respective embodiments described above, the heat sink 130 is embedded in the sealing resin 170 so that the upper surface of the cooling fins 130b of the heat sink 130 is substantially flush with the outer surface of the sealing resin 170. However, the main body 130a of the heat sink 130 may be embedded in the sealing resin 170 up to a middle of the thickness of the main body 130a. Alternatively, the heat sink 130 may not be embedded in the sealing resin 170. In that case, it is preferable that strength of the bonding between the heat sink 130 and the insulating member 124 may be increased or an intermediate metal plate not shown may be metal-bonded to the heat sink 130 so that the intermediate metal plate is buried in the sealing resin 170.

In the above embodiments, the circuit body 500 has the inverter circuit, but the present invention is also applicable to a case where the circuit body 500 has another power conversion circuit such as a converter circuit.

Besides, the present invention can be arbitrarily modified and applied within the scope of a spirit of the invention. In short, in the electronic device in which a part of each of the input terminal, the output terminal, and the ground terminal and one surface of the heat sink are exposed, and the periphery of the electronic component structure is covered with the sealing resin, there may be provided the main body conductor layer that are formed to be insulated from the input terminal and the output terminal and to cover the entire surface of an immersion region of the sealing resin and one surface of the heat sink in the cooling medium, and the ground conductor layer that covers at least a part of the ground terminal and is electrically connected with the main body conductor layer.

The disclosure content of the following priority application is incorporated herein as a quotation.

Japanese Patent Application No. 2014-220440 (filed Oct. 29, 2014)

LIST OF REFERENCE SIGNS 100, 100A to 100E: electronic device
110: electronic module
120, 120A: electronic component structure
121: electronic component
122: lead frame (thermally conductive support member)
123: wire
124: insulating member
125a to 125f: lead terminal (input terminal, control terminal, output terminal)
126, 126a, 126b, and 142: ground terminal
129: bonding material
130: heat sink
130a: main body
130b: cooling fin
141: root portion
170, 170A: sealing resin
171: groove
180, 180A: seal portion
181: sealing member
200: conductor layer
210: main body conductor layer
211: lower layer
211a lower: underlayer
211b: upper underlayer
212: upper layer
220: ground conductor layer
401: mask jig
402: sealing material
500: circuit body
501 to 504: transistor (semiconductor element)
610: facing heat dissipation structure
611: intermediate heat transfer body
612: facing insulating member
613: facing heat sink
613a: main body
613b: cooling fin

The invention claimed is:

1. An electronic device comprising:
an electronic component structure that includes a circuit body having a semiconductor element with an input electrode and an output electrode and a thermally conductive support member for supporting the semiconductor element, a heat sink that is disposed on one surface of the circuit body to be thermally conductible, a thermally conductive insulating member that is interposed between the heat sink and the thermally conductive support member, an input terminal that is connected to the input electrode, an output terminal that is connected to the output electrode, and a ground terminal;
a sealing resin that is formed to expose a part of each of the input terminal, the output terminal and the ground terminal and one surface of the heat sink, and cover a periphery of the electronic component structure;
a main body conductor layer that is formed to be insulated from the input terminal and the output terminal and formed to cover an entire surface of an immersion region of the sealing resin and one surface of the heat sink immersed in a cooling medium; and
a ground conductor layer that covers at least apart of the ground terminal and is electrically connected with the main body conductor layer.

2. The electronic device according to claim 1,
wherein the semiconductor element includes a control electrode to which a control signal is input, and the circuit body includes a plurality of the semiconductor elements that configure a power conversion circuit, and a control terminal that is connected to the control electrode, and insulated from the main body conductor layer and the ground conductor layer.

3. The electronic device according to claim 1,
wherein the heat sink includes a plurality of cooling fins, and the main body conductor layer is formed to cover respective surfaces of the cooling fins.

4. The electronic device according to claim 1,
wherein the thermally conductive support member is formed of a metal lead frame, and the input terminal, the output terminal, and the ground terminal are configured by leads formed separately from the metal lead frame.

5. The electronic device according to claim 1,
wherein the ground terminal is electrically connected to the thermally conductive support member.

6. The electronic device according to claim 1,
wherein the ground terminal includes a plurality of ground terminals, with at least a part of each of the plurality of ground terminals formed with the ground conductor layer electrically connected to the main body conductor layer.

7. The electronic device according to claim 1,
wherein the sealing resin formed to cover the periphery of the electronic component structure includes one surface on which the heat sink is disposed and a side surface adjacent to the one surface, on which the input terminal, the output terminal, and the ground terminal are disposed, and a sealing portion is disposed in the vicinity of a boundary between the one surface and the side surface.

8. The electronic device according to claim 7,
wherein the sealing portion includes a recess provided in the sealing resin and a sealing member fitted into the recess.

9. The electronic device according to claim 1,
wherein the electronic component structure includes a facing heat sink that is disposed on the other surface facing the heat sink so as to conduct heat to the circuit body.

10. The electronic device according to claim 1,
wherein the electronic component structure includes one surface on which the heat sink is disposed, a side surface adjacent to the one surface on which the input terminal, the output terminal, and the ground terminal are disposed, and a facing side surface opposite to the side surface,
the electronic component structure further includes another input terminal, another output terminal and another ground terminal which are formed on the facing side surface, and
the other input terminal, the other output terminal and the other ground terminal are electrically connected to the main body conductor layer.

11. The electronic device according to claim 1,
wherein the main body conductor layer includes an upper layer and a lower layer that is disposed between the upper layer and the sealing resin and having electric resistivity lower than that of the upper layer.

12. The electronic device according to claim 11,
wherein the ground conductor layer is formed integrally with the lower layer of the main body conductor layer, and no upper layer is formed on at least a part of the ground conductor layer.

13. A method of manufacturing the electronic device according to claim 11, comprising:
- sealing a periphery of the electronic component structure with the sealing resin in a state where a part of each of the input terminal, the output terminal, the ground terminal, and one surface of the heat sink are exposed;
- forming the lower layer on each of the input terminal, the output terminal, and the ground terminal, peripheral portions of the input terminal and the output terminal in the sealing resin, one surface of the heat sink, and a surface of the sealing resin;
- covering at least each of the input terminal and the output terminal and the peripheral portions of the input terminal and the output terminal in the sealing resin with a mask;
- forming the upper layer on the lower layer with the lower layer as a power feeding layer by electroplating; and
- removing the mask to remove the lower layer formed on the peripheral portions of the input terminal and the output terminal in the sealing resin.

14. A method of manufacturing the electronic device according to claim 11, comprising:
- sealing a periphery of the electronic component structure with the sealing resin in a state where a part of each of the input terminal, the output terminal, the ground terminal, and one surface of the heat sink are exposed;
- covering at least each of the input terminal and the output terminal and peripheral portions of the input terminal and the output terminal in the sealing resin with a mask;
- forming the lower layer on the ground terminal, one surface of the heat sink and a surface of the sealing resin;
- forming the upper layer on the lower layer formed on at least one surface of the heat sink and the surface of the sealing resin; and
- removing the mask.

15. The electronic device according to claim 1,
- wherein the main body conductor layer includes an electroless nickel plating layer, an electroless copper plating layer formed on the electroless nickel plating layer, and a nickel electroplating layer formed on the electroless copper plating layer.

* * * * *